US012372585B2

(12) United States Patent
Chemali et al.

(10) Patent No.: US 12,372,585 B2
(45) Date of Patent: *Jul. 29, 2025

(54) NEURAL-NETWORK STATE-OF-CHARGE AND STATE OF HEALTH ESTIMATION

(71) Applicants: The Trustees of Columbia University in the City of New York, New York, NY (US); McMaster University, Ontario (CA)

(72) Inventors: Ephram Chemali, Ontario (CA); Matthias Preindl, New York, NY (US)

(73) Assignees: The Trustees of Columbia University in the City of New York, New York, NY (US); McMaster University, Hamilton (CA)

( * ) Notice: Subject to any disclaimer, the term of this patent is extended or adjusted under 35 U.S.C. 154(b) by 45 days.

This patent is subject to a terminal disclaimer.

(21) Appl. No.: 18/118,231

(22) Filed: Mar. 7, 2023

(65) Prior Publication Data

US 2023/0280410 A1    Sep. 7, 2023

Related U.S. Application Data

(63) Continuation of application No. 16/688,260, filed on Nov. 19, 2019, now Pat. No. 11,637,331, which is a
(Continued)

(51) Int. Cl.
*G01R 31/392* (2019.01)
*G01R 31/382* (2019.01)
(Continued)

(52) U.S. Cl.
CPC ......... *G01R 31/392* (2019.01); *G01R 31/382* (2019.01); *H01M 10/486* (2013.01);
(Continued)

(58) Field of Classification Search
CPC ...... G01R 31/382; G01R 31/392; G06N 3/04; G06N 3/08; G06N 20/20; H01M 10/486;
(Continued)

(56) References Cited

U.S. PATENT DOCUMENTS 8,680,815 B2    3/2014  Wang et al.
8,719,195 B2    5/2014  Frisch et al.
(Continued)

FOREIGN PATENT DOCUMENTS

CN       104881001 A    9/2015
EP         2762907 A1   8/2014
WO     2014119123 A1   8/2014

OTHER PUBLICATIONS

Roscher et al., "Dynamic electric behavior and open-circuit-voltage modeling of LifePO4-based lithium ion secondary batteries," Journal of Power Sources, vol. 196, pp. 331-336, 2011.
(Continued)

*Primary Examiner* — Edward Tso
*Assistant Examiner* — Aaron Piggush
(74) *Attorney, Agent, or Firm* — Quarles & Brady, LLP

(57) ABSTRACT

An approach to control or monitoring of battery operation makes use of an artificial neural network (ANN), which receives one or more battery attributes for a Lithium ion (Li-ion) battery, and determines, based on the received one or more battery attributes, a state-of-charge (SOC) and/or a state-of-health (SOH) estimate for the Li-ion battery. The ANN includes at least one of a recurrent neural network (RNN) and a convolutional neural network (CNN), and the series of values of the battery attributes includes at one of battery voltage values, battery current values, and battery temperature values.

22 Claims, 23 Drawing Sheets

Related U.S. Application Data continuation-in-part of application No. 16/194,596, filed on Nov. 19, 2018, now Pat. No. 11,171,498.

(60) Provisional application No. 62/769,039, filed on Nov. 19, 2018, provisional application No. 62/588,510, filed on Nov. 20, 2017.

(51) Int. Cl.

| | |
|---|---|
| *H01M 10/48* | (2006.01) |
| *H02J 7/00* | (2006.01) |
| *G06N 3/045* | (2023.01) |
| *G06N 3/08* | (2023.01) |
| *G06N 20/20* | (2019.01) |

(52) U.S. Cl.
CPC ............ *H02J 7/0048* (2020.01); *H02J 7/005* (2020.01); *H02J 7/007192* (2020.01); *G06N 3/045* (2023.01); *G06N 3/08* (2013.01); *G06N 20/20* (2019.01)

(58) Field of Classification Search
CPC ........... H01M 10/0525; H01M 10/4257; H02J 7/0047; H02J 7/0048; H02J 7/0091; H02J 7/007192; H02J 7/005
USPC ........... 320/132, 133, 134, 152, 157; 702/63
See application file for complete search history.

(56) References Cited

U.S. PATENT DOCUMENTS

| | | | | |
|---|---|---|---|---|
| 11,171,498 | B2 | 11/2021 | Chemali et al. | |
| 11,637,331 | B2* | 4/2023 | Chemali ............... | G01R 31/382 702/63 |
| 2008/0234956 | A1* | 9/2008 | Mizuno ................. | G01R 31/367 702/63 |
| 2009/0326841 | A1 | 12/2009 | Zhang et al. | |
| 2010/0324848 | A1* | 12/2010 | Cho ...................... | B60L 3/0046 702/63 |
| 2012/0271578 | A1* | 10/2012 | Nareid ................. | G01R 31/3648 702/63 |
| 2013/0119921 | A1* | 5/2013 | Choe ..................... | H01M 10/48 320/106 |
| 2014/0092375 | A1* | 4/2014 | Raghavan ............. | H01M 10/48 356/32 |
| 2016/0209472 | A1* | 7/2016 | Chow ................... | G01R 31/392 |
| 2017/0023649 | A1 | 1/2017 | You et al. | |
| 2018/0129893 | A1* | 5/2018 | Son .......................... | G06N 3/08 |
| 2018/0136285 | A1* | 5/2018 | You ....................... | G01R 31/392 |
| 2019/0157891 | A1 | 5/2019 | Chemali et al. | |
| 2020/0081070 | A1 | 3/2020 | Chemali et al. | |

OTHER PUBLICATIONS

Sepasi et al., "Improved extended Kalman filter for state of charge estimation of battery pack," Journal of Power Sources, vol. 255, pp. 368-376, Jun. 2014.
Sun et al., "Adaptive unscented Kalman filtering for state of charge estimation of a lithium-ion battery for electric vehicles," Energy, vol. 36, No. 5, pp. 3531-3540, May 2011.
Sutskever, "Training Recurrent Neural Networks," Ph.D. dissertation, University of Toronto, 2013.
Tong, "Battery state of charge estimation using a load-classifying neural network," Journal of Energy Storage, vol. 7, pp. 236-243, Aug. 2016.
United States Environmental Protection Agency, Vehicle and Fuel Emissions Testing, https://epa.gov/vehicle-and-fuel-emissions-testing/dynamometer-driveschedules#vehicleDDS, (2017).
Waag et al., "Critical review of the methods for monitoring of lithium-ion batteries in electric and hybrid vehicles," Journal of Power Sources, vol. 258, pp. 321-339, 2014.
Wang et al., "Comparison of Kalman Filter-based state of charge estimation strategies for Li-Ion batteries," 2016 IEEE Transporation Electrification Conference and Expo (ITEC), pp. 1-6, 2016.
Wang et al., "Deep Learning for Identifying Metastatic Breast Cancer," ArXiv Preprint, 1-6arXiv:1591239, 2016.
Weng et al., "State-of-health monitoring of lithium-ion battery models and packs via incremental capacity peak tracking," Applied Energy, vol. 180, pp. 360-368, Oct. 2016.
World Energy Outlook Special Report: Energy and Air Pollution, International Energy Agency, pp. 1-6, Jun. 2016.
Zaremba et al., "Recurrent neural network reularization," arXiv preprint arXiv: 1409.2329, Feb. 2015.
Abadi et al., "TensorFlow: Large-Scale Machine Learning on Heterogeneous Systems," pp. 1-19, Nov. 2015.
Ahmed et al., "Reduced-Order Electrochemical Model Parameters Identification and SOC Estimation for Healthy and Aged Li-Ion Batteries Part 1: Parameterization Model Development for Healthy Batteries," IEEE Journal of Emerging and Selected Topics in Power Electronics, vol. 2, No. 3, pp. 659-677, Sep. 2014.
Ahmed et al., "Reduced-Order Electrochemical Model Parameters Identification and State of Charge Estimation for Healthy and Aged Li-Ion Batteries-Part II: Aged Battery Model and State of Charge Estimation," in IEEE Journal of Emerging and Seleceted Topics in Power Electronics, vol. 2, No. 3, pp. 678-690, Sep. 2014.
Amodei et al., "Deep Speech 2: End-to-End Speech Recognition in English and Mandarin," ArXiv e-prints, Dec. 2015.
Andre et al., "Comparative study of a structured neural network and an extended Kalman filter for state of health determination of lithium-ion batteries in hybrid electricvehicals," in Engeenering Applications of Artificial Intelligence, vol. 26, No. 3, pp. 951-961, Mar. 2013.
Anton et al., "Battery state-of-charge estimator using the SVM technique," Applied Mathematical Modelling, vol. 37, No. 9, pp. 6244-6253, May 2013.
Anton et al., "Support Vector Machines Used to Estimate the Battery State of Charge," IEEE Transactions on Power Electronics, vol. 28, No. 12, pp. 5919-5926, Dec. 2013.
Chang, Estimation of the state of charge for a LFP battery using a hybrid method that combines a RBF neural network, an OLS algorithm and AGA,: International Journal of Electrical Power & Energy Systems, vol. 53, pp. 603-611, Dec. 2013.
Charkhgard et al., "State-of-Charge Estimation for Lithium-Ion Batteries Using Neural Networks and EKF," in IEEE Transactions on Industrial Electronics, vol. 57, No. 12, pp. 4178-4187, Dec. 2010.
Chemali et al., "Electrochemical an delectrostatic energy storage and managment systems for electric drive vehicles: State-of-the-art review and future trends," IEEE Journal of Emerging and Selected Topics in Power Electronics, vol. 4, No. 3, pp. 1117-1134, Sep. 2016.
Chen et al., "A novel approach for state of charge estimation based on adaptive switching gain sliding mode observer in electric vehicles," Journal of Power Sources, vol. 246, pp. 667-678, 2014.
Ciresan et al., "Multi-Column Deep Neural Network for Traffic Sign Classification," Neural Network, vol. 32, pp. 333-338, 2012.
Dahl et al., "Context-Dependent Pre-Trained Deep Neural Networks for Large-Vocabulary Speech Recognition," IEEE Transactions on Audio, Speech, and Language Processing, vol. 20, No. 1, pp. 30-42, Jan. 2012.
Deng et al., "Online available capacity predition and state of charge estimation based on advanced data-driven algorithms for lithium iron phosphate battery," Energy, vol. 112, pp. 469-480, Oct. 2016.
Deng, "Deep Learning: Methods and Applications," Foundations and Trends in Signal Processing, vol. 7, No. 3-4, pp. 197-387, 2014.
Dong et al., "Lithium-ion battery state of health monitoring and remaining useful life prediction based on support vector regression-particle filter," Journal of Power Sources, vol. 271, pp. 114-123, Dec. 2014.
Du et al., "State of charge estimation for Li-ion battery based on model from extreme learning machine," Control Engineering Practice, vol. 26, pp. 11-19, May 2014.

(56) References Cited

OTHER PUBLICATIONS

Dubarry et al., "State of health battery estimator enabling degradation diagnosis: Model and algorithm description," Journal of Power Sources, vol. 360, pp. 56-69, Aug. 2017.

Emadi, "Advanced Electric Drive Vehicles," New York: CRC Press, 2015.

Ganguli et al., "Embedded fiber-optic sensing for accurate internal monitoring of cell state in advanced battery management systems part 2: Internal cells signals and utility for state estimation," Journal of Power Sources, vol. 341, pp. 474-482, Feb. 2017.

Gholizadeh et al., "Estimation of state of charge, unknown nonlinearities, and state of health of a lithium-ion battery based on a comprehensive unobservable model," IEEE Transactions on Industrial Electronics, vol. 61, No. 3, pp. 1335-1344, Mar. 2014.

Graves et al., "Speech Recognition with Deep Recurrent Neural Networks," 2013 IEEE International Conference on Acoustics, Speech and Signal Processing (ICASSP), No. 3, pp. 6645-6649, 2013.

Hansen et al., "Support vector based battery state of charge estimator," Journal of Power Sources, vol. 141, No. 2, pp. 351-358, 2005.

He et al., "Deep Residual Learning for Image Recognition," Arxiv. Org, pp. 171-180, 2015.

Hinton et al., "Deep Neural Networks for Acoustic Modeling in Speech Recognition: The Shared Views of Four Research Groups," in IEEE Signal Processing Magazine, vol. 29, No. 6, pp. 82-97, Nov. 2012.

Hochreiter et al., "Long short-term memory," Neural Computation, vol. 9, No. 8, pp. 1735-1780, 1997.

Hochreither, "The vanishing gradient problem during learning recurrent neural nets and problem solutions," International Journal of Uncertainty, Fuzziness and Knowledge-Based Systems, vol. 6, No. 2, pp. 107-116, Apr. 1998.

Hu et al., "A multiscale framework with extended kalman filter for lithium-ion battery {SOC} and capacity estimation," Applied Energy, vol. 92, pp. 694-704, 2012.

Hu et al., "Advanced Machine Learning Approach for Lithium-Ion Battery State Estimation in Electric Vehicles," in IEEE Transactions on Transportation Electrification, vol. 2, No. 2, pp. 140-149, Jun. 2016.

Hu et al., "Condition Monitoring in Advanced Battery Management Systems: Moving Horizon Estimation Using a Reduced Electrochemical Model," in IEEE/ASME Transactions on Mechatronics, vol. 23, No. 1, pp. 167-178, Feb. 2018.

Hu et al., "Fuzzy Clustering Based Multi-model Support Vector Regression State of Charge Estimator for Lithium-ion Battery of Electric Vehicle," 2009 International Conference on Intelligent Human-Machine Systems and cybernetics, pp. 392-396, 2009.

Hu et al., "Technological Developments in Batteries: A Survey of Principal Roles, Types, and Management Needs," in IEEE Power and Energy Magazine, vol. 15, No. 5, pp. 20-31, Sep.-Oct. 2017.

Kingma et al., "Adam: A method for stochastic optimization," CoRR, vol. abs/1412.6980, 2014.

Kollmeyer et al., "Design of an electric powertrain for a Ford F150 crew cab truck utilizing a lithium battery pack and an interior PM synchronous machine drive," 2012 IEEE Transporation Electrification Conference and Expo (ITEC), pp. 1-8, 2012.

Kollmeyer, "Development and Implementation of a Battery-Electric Light-Duty Class 2a Truck including Hybrid Energy Storage," Ph.D. dissertation, The University of Wisconsin—Madison, 2015.

Kollmeyer, "Panasonic 18650PF Li-ion Battery Data," Mendeley Data, v1, (2018) https://doi.org/10.17632/wykht8y7tg.1.

Krizhevsky et al., "ImageNet Classification with Deep Convolutional Neural Networks," Advances in Neural Information Processing Systems, pp. 1-9, 2012.

LeCun et al., "Deep learning," Nature, vol. 521, No. 7553, pp. 436-444, May 2015.

Lee et al., "Soft Computing for Battery State-of-Charge (BSOC) Estimation in Battery String Systems," in IEEE Transactions on Industrial Electronics, vol. 55, No. 1, pp. 229-239, Jan. 2008.

Li et al., "A comparative study of state of charge estimation algorithms for LiFePO4 batteries used in electric vehicles," Journla of Power Sources, vol. 230, pp. 244-250, 2013.

Li et al., "On state-of-charge determination for lithium-ion batteries," Journal of Power Sources, vol. 348, pp. 281-301, Apr. 2017.

Liu et al., "Integrated System Identification and State-of-Charge Estimation of Battery Systems," in IEEE Transactions on Energy Conversion, vol. 28, No. 1, pp. 12-23, Mar. 2013.

Liu et al., "Prognostics for state of health estimation of lithium-ion batteries based on combination Gaussian process functional regression," vol. 53, No. 6, pp. 832-839, Jun. 2013.

Ma et al., "Deep Neural Nets as a Method for Quantitative Structure-Activity Relationships," Journal of Chemical Information and Modeling, vol. 55, No. 2, pp. 263-274, Jan. 2015.

Malysz et al., "State-of-charge and state-of-health estimation with state constraints and current sensor bias correction for electrified powertrain vehicle batteries," IET Electrical Systems in Transportation, vol. 6, No. 2, pp. 136-144, 2016.

McCurlie et al., "Fast Model Predictive Control for Redistributive Lithium-Ion Battery Balancing," in IEEE Transactions on Industrial Electronics, vol. 64, No. 2, pp. 1350-1357, Feb. 2017.

Meng et al., "Lithium Polymer Battery State-of-Charge Estimation Based on Adaptive Unscented Kalman Filter and Support Vector Machine," IEEE Transactions on Power Electronics, vol. 31, No. 3, pp. 2226-2238, Mar. 2016.

Panasonic, "Panasonic NCR18650PF Lithium-Ion Battery Datasheet (Jun. 2016)," 2016.

Panasonic, "Introduction of NCR18650PF, Panasonic," 2013.

Pascanu et al., "On the difficulty of training recurrent neural networks." 30th International Conference on Machine Learning (ICML), vol. 28, pp. 1310-1318, 2013.

\* cited by examiner

NEURAL-NETWORK STATE-OF-CHARGE AND STATE OF HEALTH ESTIMATION

CROSS-REFERENCE TO RELATED APPLICATIONS

This application is a Continuation of U.S. application Ser. No. 16/688,260, filed on Nov. 19, 2019, which is a Continuation-in-Part of U.S. application Ser. No. 16/194,596, filed Nov. 19, 2018, which claims the benefit of U.S. Provisional Application No. 62/588,510, filed Nov. 20, 2017.

This application also claims the benefit of U.S. Provisional Application No. 62/769,039, filed Nov. 19, 2018.

Each of the above-referenced applications is incorporated herein by reference in its entirety.

PRIOR DISCLOSURES BY INVENTOR

Ephrem Chemali, Phillip J. Kollmeyer, Matthias Preindl, Ryan Ahmed, and Ali Emadi. "Long short-term memory networks for accurate state-of-charge estimation of Li-ion batteries." *IEEE Transactions on Industrial Electronics* 65, no. 8 (Dec. 27, 2017): 6730-6739.

Chemali, Ephrem, Phillip J. Kollmeyer, Matthias Preindl, and Ali Emadi. "State-of-charge estimation of Li-ion batteries using deep neural networks: A machine learning approach." *Journal of Power Sources* 400 (Aug. 16, 2018): 242-255.

These publications are incorporated herein by reference.

BACKGROUND

This application relates to estimation of battery characteristics including State-of-Charge (SOC) and State-of-Health (SOH) using artificial neural networks, and in particular relates to use of Long Short-Term Memory (LSTM) neural networks and Deep Feedforward Neural Networks (DFNN) for such estimation State-of-Charge (SOC) may be defined as the remaining charge within the battery pack and is given by the residual capacity of the battery divided by its nominal capacity. There exists no direct way to measure SOC, therefore estimation approaches are used. SOC estimation is important for reliable operation of the electric powered vehicles because this quantity directly gauges a vehicle's remaining driving range and is used for the battery balancing system. SOC estimation can be a cumbersome task because the battery undergoes erratic dynamics during repeated acceleration and deceleration of electrified vehicles.

Battery aging is typically determined through a State of Health (SOH) estimation which has a value ranging between 0 and 100%. As used in this document, SOH is defined as the ratio of aged and new capacity of the battery. In some industries like the automotive industry, a standard for end of life of a Li-ion battery is when SOH=80% is reached. SOH is not an observable quantity and is a highly non-linear entity, dependent, in large part, on the volatility of loading profiles, ambient temperature, Depth of Discharge (DOD) and self-discharge, to name a few.

It is difficult for a battery model to capture all the underlying electrochemical processes and provide accurate estimates of SOC and SOH.

In general, the SOC and SOH can be considered to be a nonlinear function of variables including temperature and past discharge/charge current. For example, two SOC estimation techniques have been used; open-circuit-voltage based techniques and coulomb counting. These are commonly known to have their limitations and have been generally displaced by more sophisticated methods. Typically, these methods use an (adaptive) cell model, voltage, and current measurements to issue an estimate, e.g. Luenberger observer, adaptive observer, sliding mode observer, and Kalman Filters. These strategies tend to be computationally intensive and typically require additional parameters or different models to perform SOC estimation at varying ambient conditions.

Strategies involving data analytics have also been used in the past; these have relied on conventional machine learning techniques such as Support Vector Machines (SVM) and Neural Networks.

SUMMARY

In one aspect, in general, a method for monitoring a battery state includes receiving by an artificial neural network (ANN) a time series of values one or more battery attributes for a battery. The ANN determines, based on the received time series, the battery state. The ANN includes at least one of a recurrent neural network (RNN) and a convolutional neural network (CNN). The battery state includes at least one of a state of charge (SOC) and a state of health (SOH). The series of values of the battery attributes includes at one of battery voltage values, battery current values, and battery temperature values.

Aspects can include one or more of the following features.

The ANN comprises a CNN. For example, the CNN comprises a plurality of layers, including at least one pooling layer and at least one fully connected layer.

The battery state comprises a state-of-health (SOH) of the battery. For instance, the SOH represents a capacity of the battery (e.g., a relative capacity relative to a maximum capacity).

The battery attributes (e.g., the inputs to the ANN) include a state-of-charge (SOC) of the battery. For example, the time series of SOC is determined using a RNN based on battery attributes including battery voltage and battery current.

The determined battery state is provided for controlling operation of the battery or an electrical apparatus coupled to the battery.

The battery comprises a rechargeable battery.

Receiving the time series of values of the attributes includes receiving a time series spanning multiple charging and discharging cycles.

Determining the battery state includes determining a battery state at a first time dependent on the received time series of battery attributes spanning greater than 30 minutes of operation of the battery. For example, the time series is sampled at a rate of at least one sample per 10 seconds, and the battery state at the first time is dependent on at least 256 time samples of the time series.

Receiving time series of the values the one or more battery attributes comprises receiving values of two or more of the battery voltage, the battery current, and the battery temperature.

The battery comprises a Lithium-ion (Li-ion) battery.

The method include determining values of parameters of the ANN, and configuring the ANN with said determined values.

Determining the values of the parameters includes processing a plurality of time series of battery attributes and corresponding battery state, the plurality of time series spanning a plurality of different state-of-charge profiles.

DETAILED DESCRIPTION

Figure 1:
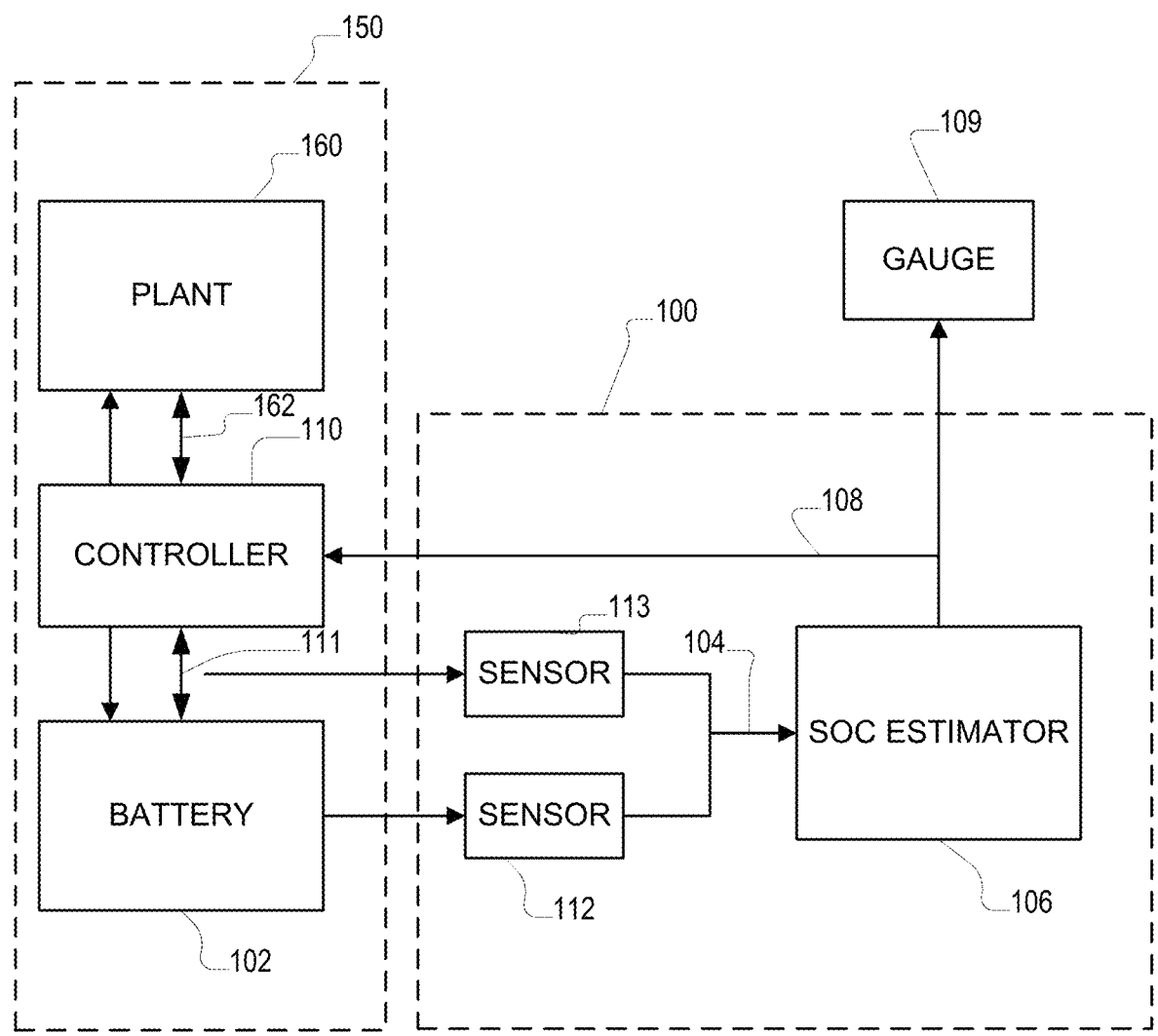
FIG. 1 is a system including a State-of-Charge (SOC) estimation system.

A number of related approaches to control or monitoring of battery operation each makes use of a neural network, which receives one or more battery attributes for a Lithium ion (Li-ion) battery, and determines, based on the received one or more battery attributes, a state-of-charge (SOC) estimate and/or a state-of-health for the Li-ion battery. A first approach to using a recurrent neural network (RNN) for estimation of SOC is first described, followed by a description of feedforward approaches for SOC and SOH estimation.

1 State-of-Charge Estimation Using a Recurrent Neural Network

Embodiments of the approach described below are used to process a time series of measurable characteristics of a battery system and output an estimate of a state of a battery system. The battery system may be referred to below as a "battery" understanding that the term may include other elements, including electronics and physical systems of the battery system. In particular, embodiments of the approach are directed to output of an estimate of a state of charge (SOC) of the battery system. In general, the SOC represents the remaining electrical charge in the battery system, for example, as measured in units of electrical charge (e.g., Coulombs) or as corresponding quantity (e.g., a normalized number between 0% and 100% representing a fractional charge state of the battery system).

The measurable characteristics may be represented as a vector of real quantities $x_k$ for the $k^{th}$ sample in the series. (In some description below, the variable $\Psi_k$ is used synonymously to represent such a vector of quantities.) For example, the characteristics are measured at a rate of one vector measurement per second. For example, each vector may include the terminal current, the terminal voltage, and a battery temperature at the measurement time. The measurement does not necessarily include all three of these quantities, and may include other quantities, such as an age of battery system. Furthermore, related quantities, such as normalized current and voltage (e.g., normalized by nominal or maximum values for the battery system) and time averaged or filtered versions of such signals may be used in addition or as alternatives.

The estimates of the battery state are represented as a real scalar or vector quantity $y_k$ for each time sample. For example, as introduced above, for each time sample, the output $y_k$ may be a number between 0.0 and 1.0. (In some description below, the variable $SOC_k$ is used to represent such a state of charge.)

In general, the approach implements a non-linear function $y_k = N(x_1, x_2, \ldots, x_k)$ that accumulates the information in the history of measurements from the time the battery system was known to be in a fully charged state (e.g., at time index 1). A recurrent structure may be used in which a hidden estimation state $s_k$ is maintained such that the output $y_k$ is a (generally non-linear) function of $s_k$, and $s_k$ is a (generally non-linear) function of $x_k$ and $s_{k-1}$.

Various structures of the function N may be used, and in general, the function is parameterized by a set of parameters that are estimated ("trained") in a manner described more fully below. One particular structure that may be used is a Recurrent Neural Network (RNN) with one hidden layer. In such an example, the function N is parametrized by numerical matrices U, V, and W, that define the function according to the following computations:

$$u_k = W^T s_{k-1} U^T x_k$$

$$s_k = \kappa_s(u_k)$$

$$o_k = V^T s_k$$

$$y_k = \eta_o(o_k)$$

where $\eta_s$ and $\eta_o$ are non-linear scalar functions that are applied element-wise to their arguments. For example, these may be selected from a sigmoid function, a hyperbolic tangent, and a rectifier (i.e., maximum of zero and the argument). More than one layer may be optionally used.

In order to determine the parameters of the function N, which may also be referred to as "weights," a training data set is used. For example, an accurate battery system state $y^*_k$ is monitored, for example, using an accurate "Coulomb counting" apparatus, as well as the corresponding measurable quantities $x_k$. One or more sequences $(x_k, y^*_k)$ k=1, . . . , T are collected, and are collectively referred to as the "training data" for the parameter estimation. For example, each sequence corresponds to repeated charge-discharge cycles of one battery system.

Various approaches to parameter estimation may be used to match the training data according to a specified quantified objective $L(y_k, y^*_k)$. For example, the objective may be $$\sum_k L(y_k, y_k^*) = \frac{1}{2} \sum_k (y_k - y_k^*)^2$$

or $$\sum_k L(y_k, y_k^*) = \sum_k |y_k - y_k^*|$$

Referring to FIG. 1, an exemplary state of charge (SOC) estimation system 100 is configured to make a determination of a state of charge (SOC) of a battery 102. In this example, the battery 102 is a Lithium ion (Li-ion) battery, but other battery technologies may be addressed with the same approach. The battery may be part of a battery powered system 150, which includes the battery 102, a controller 110 coupled to the battery, and a plant 160, which may be a source and/or sink of power. Very generally, the controller 110 in this example is coupled to the battery over a power connection 111 (e.g., two electrical conductors), and optionally is coupled over a control path on which environmental control may be exerted on the battery (e.g., temperature, pressure, etc.). The controller mediates power transfer between the battery 102 and the plant 162, which is coupled to the controller over a power connection 162. In some examples, the SOC estimation system 100 may be configured to provide an estimate of the SOC of the battery 102 to the controller 110; in other examples, the SOC estimation system 100 operates without communication with the controller 110, for example, providing the estimate of the SOC via a gauge 109 to a user.

The SOC estimation system 100 includes sensors 112, 113 that are used to monitor the battery 102 and provide quantitative attributes associated with the battery over time, for example, as a time-sampled digitized signal. A first sensor 112 monitors environmental or other physical conditions of the battery, for instance temperature, pressure, or age while a second sensor 113 monitors the power connection 112 over which power flows into and out of the battery, and provides attributes including voltage (e.g., voltage across the two conductors, or across two terminals of the battery to which such conductors are connected) and current passing over the conductors of the power connection and/or an accumulation or other averaging or filtering of current over time. Together, all the attributes monitored by the sensors 112, 113 form a vector time signal 104, with the $k^{th}$ sample denoted $x_k$ or $\Psi_k$.

The SOC estimation system 100 includes an SOC estimator 106, which receives the attributes 104 from the sensors 112, 113, and outputs a SOC estimate 108. As introduced above, the SOC estimate may optionally be provided back to the controller 110 for the battery, to a gauge 109, or for other purposes (e.g., logging, long-term battery health assessment, etc.). The SOC estimator 106 is a parameterized estimator that is configured with values of a set of configuration parameters. In this example, the SOC estimator makes use of a particular structure of a recurrent neural network (RNN), which is described in more detail below. As discussed above, the output of the SOC estimator 106 generally includes the state of charge (e.g., a number between 0% and 100% representing the percentage of full capacity remaining in the charge of the battery), but may additionally or alternatively include other quantities characterizing the state of the battery, for instance, an estimate of the internal resistance of the battery, the remaining lifetime of the battery, and so forth.

Classical RNNs generally provide the output of the neural network at time k−1 as a further input at time k augmenting the input provided to the neural network. Such classical RNNs are known to have certain difficulties capturing long-range dependencies, at least in part resulting from training procedures in which gradients of the weights either explode or vanish during training. The neural network structure used in this exemplary embodiment includes RNNs with Long Short-Term Memory (LSTM) cells to better capture long-term dependencies within a sequence of battery attributes.

Neural Network

Figure 2:
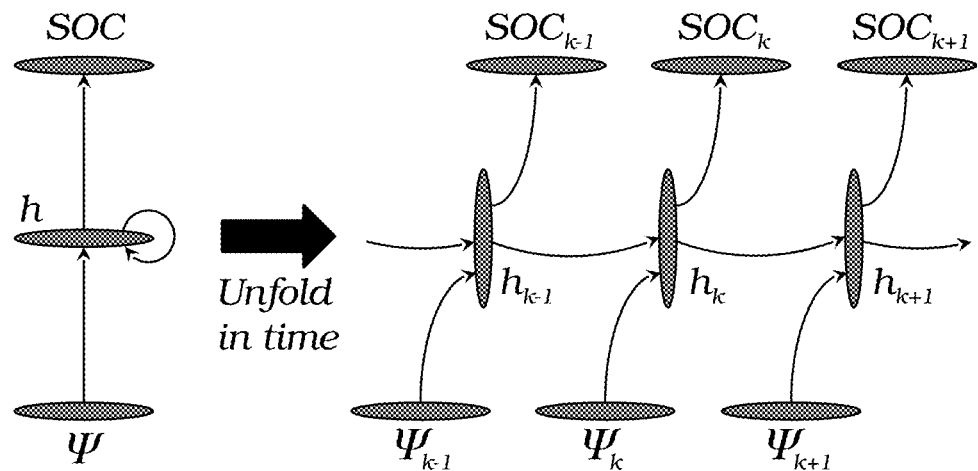
FIG. 2 is an architecture of a recurrent neural network.

An LSTM-RNN, whose architecture is shown in FIG. 2, can represent nonlinear dynamic systems by mapping input sequences to output sequences [Hochreiter and Schmidhuber, 1997]. The input data is given by $\Psi_k=[V(k), I(k), T(k)]$ where V(k), I(k) and T(k) represent the voltage, current and temperature of the battery at time step k. $h_{k-1}$ denotes the hidden layer of the LSTM-RNN at time step k−1. The output of the LSTM-RNN is the estimated SOC at every time step.

Figure 3:
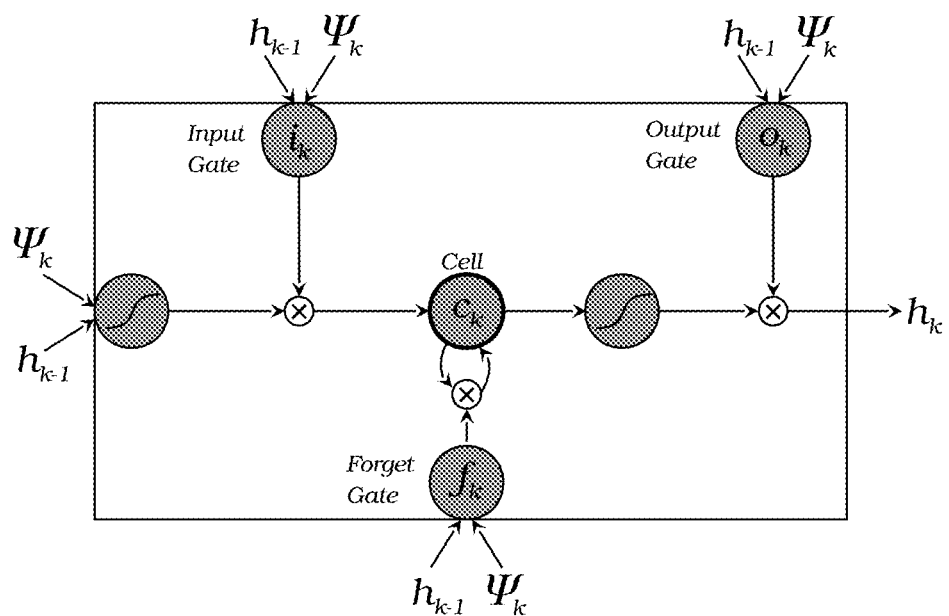
FIG. 3 is a Long Short-Term Memory cell.

When LSTM-RNNs are applied towards SOC estimation, a typical dataset used to train the networks is given by $D=\{(\Psi_1, SOC^*_1), (\Psi_2, SOC^*_2), \ldots, (\Psi_N, SOX^*_N)\}$, where $SOC^*_K$ is the ground-truth value or the observable state-of-charge value at time step k and $\Psi_k$ is the vector of inputs also at time step k. The vector of inputs is defined as $\Psi_k=[V(k), I(k), T(k)]$, where V (k), I(k), T(k) are the voltage, current and temperature of the battery measured at time step k, respectively. The Long Short-Term Memory cell whose schematic representation is shown in FIG. 3, is equipped with a memory cell, $c_k$, which stores the long-term dependencies. $\Psi_k$ and $h_{k-1}$ are the input data layer at current time step, k, and hidden layer at previous time step, k−1, respectively. $i_k$, $o_k$, $f_k$ and $c_k$ are the input, output and forget gates as well as the memory cell, respectively. Cells with sigmoidal notations represent nonlinearities outlined in equation 6.

During training, the input, output and forget gates allow the LSTM to forget or write new information to the memory cell. The overall LSTM-RNN cell is therefore automatically configured such that the memory cell maintains a most useful summary of past operation of the battery to be used in making estimates of the battery state in the future.

The LSTM unit can be represented by the following composite function, $$i_k = \eta(W_{\Psi i}\Psi_k + W_{hi}h_{k-1} + b_i)$$

$$f_k = \eta(W_{\Psi f}\Psi_k + W_{hf}h_{k-1} + b_f)$$

$$c_k = f_k c_{k-1} + i_k \tan h(W_{\Psi c}\Psi_k + W_{hc}h_{k-1} + b_c)$$

$$o_k = \eta(W_{\Psi o}\Psi_k + W_{ho}h_{k-1} + b_o)$$

$$h_k = o_k \tan h(c_k), \tag{1}$$

where the initial hidden state, $h_0$, is set to a zero matrix, $\eta$ is the sigmoid function and i, f, o and c are the input, forget, output gates and memory cell, respectively. They are called gates because they are a sigmoid function that can be zero valued thus possessing the ability to inhibit the flow of information to the next computational node. Each gate possesses its set of network weights, which are denoted by W. The subscripts of W describe the transformation occurring between the two respective components, e.g. the input-output gate matrix is denoted by $W_{\Psi o}$, the hidden-input gate matrix is denoted by $W_{hi}$, etc. A bias, b, is added to the matrix multiplication at each gate to increase the networks flexibility to fit the data. A final fully connected layer performs a linear transformation on the hidden state tensor $h_k$ to obtain a single estimated SOC value at time step k. This is done as follows:

$$SOC_k = V_{out}h_k + b_y \tag{2}$$

where $V_{out}$ and by are the fully connected layer's weight matrix and biases, respectively. The disparity between the LSTM-RNN's estimated SOC and the measured one is best represented by the following loss function computed at the end of each forward pass;

$$L = \sum_{k=0}^{N} \frac{1}{2}(SOC_k - SOC_k^*)^2, \tag{3}$$

where N is the length of the sequence and $SOC_k$ as well as $SOC^*_k$ are the estimated and ground truth values of SOC at time step k, respectively. A forward pass starts when the training data is fed into the network and ends when the SOC estimates are generated at each time step as well as when the errors and the overall loss are calculated. However, a training epoch, e, includes one forward pass and one backward pass, in which is the network weights, W, and biases, b, are updated. To do this, an optimization method called Adam is used [Kingma and Ba, 2014] to update the network weights and biases based on the gradient of the loss function. This is given by:

$$m_\epsilon = \beta_1 m_{\epsilon-1} / \nabla L(W_{\epsilon-1}) \tag{4}$$

$$r_\epsilon = \beta_2 r_{\epsilon-1} / \nabla L(W_{\epsilon-1})^2$$

$$\tilde{m}_\epsilon = m_\epsilon / (1 - \beta_1^\epsilon)$$

$$\tilde{r}_\epsilon = r_\epsilon / (1 - \beta_2^\epsilon)$$

$$W_\epsilon = W_{\epsilon-1} - \alpha \frac{\tilde{m}_\epsilon}{\tilde{r}_\epsilon - \kappa}$$

where, L is the loss function, $\beta_1$ and $\beta_2$ are decay rates in some examples set to 0.9 and 0.999, respectively, $\alpha = 10^{-4}$ is the training step size and IC is a constant term set in some examples to $10^{-8}$. $W_\epsilon$ denotes the matrix of neural network parameters ("weights") at the current training epoch and can be a placeholder for $W_{\Psi i}$, $W_{hi}$, $W_{\Psi f}$, etc. These gate matrices, the output weight matrix, $V_{out}$, as well as the biases are initialized with a normally distributed random number generator having mean 0 and standard deviation of 0.05. It is only during training that a forward and backward pass are performed to continuously update the network weights until a convergence criteria is met. With the backward pass, the network self-learns its weights, offering significant improvements over traditional SOC estimation strategies, which require the time-consuming construction and parameterization of hand-engineered battery models.

During validation, a forward pass is solely required to generate the estimated SOC values at each time step and no backward pass is needed because the network parameters have already been learned during training. The LSTM-RNN offers an advantage of lower computational overhead, once trained, since a forward pass is comprised of a series of matrix multiplications. This, in general, is less computationally intensive than other algorithms, which might contain differential equations, for example. In addition, the LSTM-RNN, as will be shown in the results section below, has the ability to encode the characteristic behavior of a battery at numerous ambient temperatures, thus reducing the memory required to store different parameters for different ambient temperatures as is typically done for traditional battery models. Therefore, these latter advantages make LSTM-RNN a great candidate to perform estimation separately on many cells in a battery pack.

Many unique drive cycles are concatenated to form the training dataset and when compiled, this concatenation typically has a length of over 100,000 time steps. It may not be possible to enter a sequence as long as this into the training system (e.g. constrained by GPU memory), therefore, the LSTM-RNN models may be trained by feeding one batch of the sequence at a time which is commonly performed while training LSTM-RNNs. This is referred to as unrolling the LSTM cell in time for 1V steps, where AT is the batch length holding a smaller value than the total training sequence length, N, such that Ñ<N. Usually, if the time constant of the inherent dynamics within the sequence is shorter than Ñ, then the LSTM-RNN can still capture the time dependencies.

To evaluate the estimation performance of our networks, a few different error functions may be used. These include the Mean Absolute Error (MAE), the RMS error, the standard deviation of the errors (STDDEV) and the maximum error (MAX).

Experiments and Results

A Panasonic 18650 battery cell with a lithium nickel cobalt aluminum oxide ($LiNiCoAlO_2$ or NCA) chemistry, similar to the cell used in some Tesla vehicles, was tested [Panasonic, 2016]. The battery, which is rated to have 43 mQ dc resistance has the following characteristics:
Nominal Open Circuit Voltage: 3.6V
Capacity: Min. 2.75 Ah/Typ. 2.9 Ah
Min/Max Voltage: 2.5V/4.2V
Mass/Energy Storage: 48 g/9.9 Wh
Minimum Charging Temperature: 10° C.
Cycles to 80% Capacity: 500 (100% DOD, 25° C.)

Figure 4A:
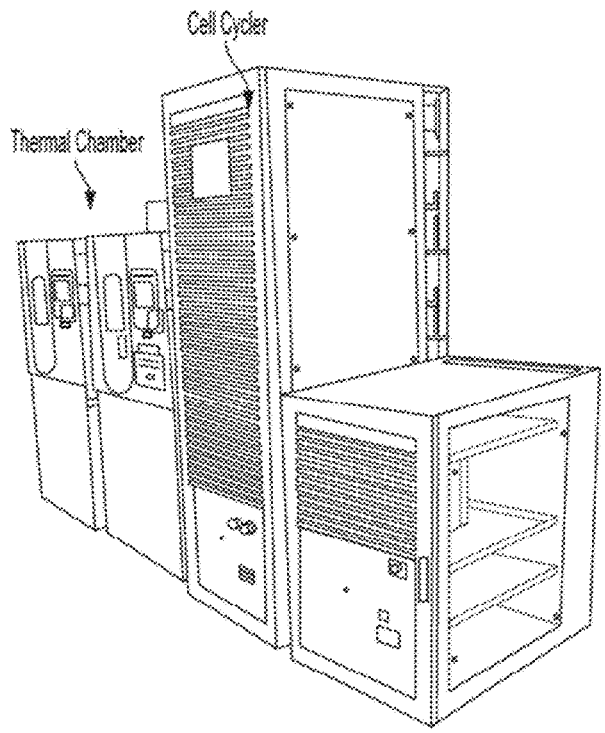
FIGS. 4a, 4b, and 4c are an experimental setup including, respectively, a) a photograph of equipment used for battery testing, b) a flowchart of the battery test procedure and c) a schematic of the test bench and data logging system.

All the testing was performed in a thermal chamber with cell testing equipment manufactured by Digatron Firing Circuits, as described below and shown in FIG. 4*a*).

Cycler Manufacturer: Digatron Firing Circuits
Test Channel Used: 25 A, 0-18V channel
Voltage/Current Accuracy: +/−0.1% Full Scale
Data Acquisition Rate Used: 10 Hz
Thermal Chamber: Cincinnati Sub Zero ZP-8
Size: 8 cu. Ft.
Accuracy: +/−0.5° C.

Figure 4B:
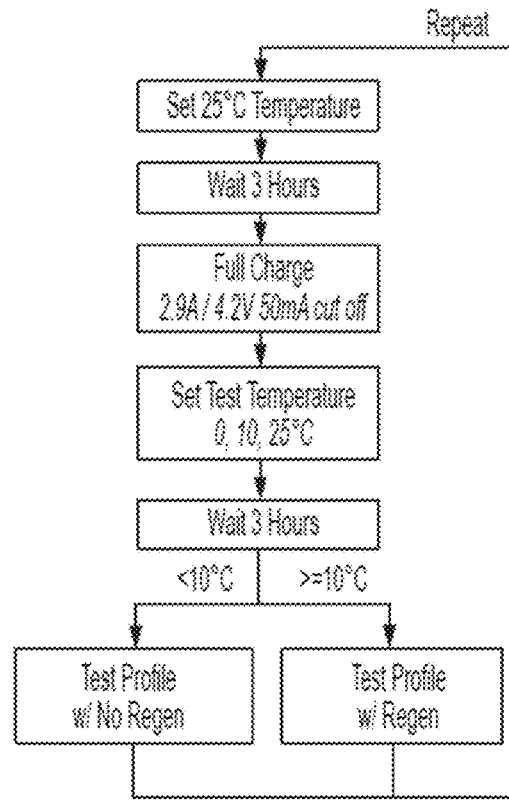
Figure 4C:
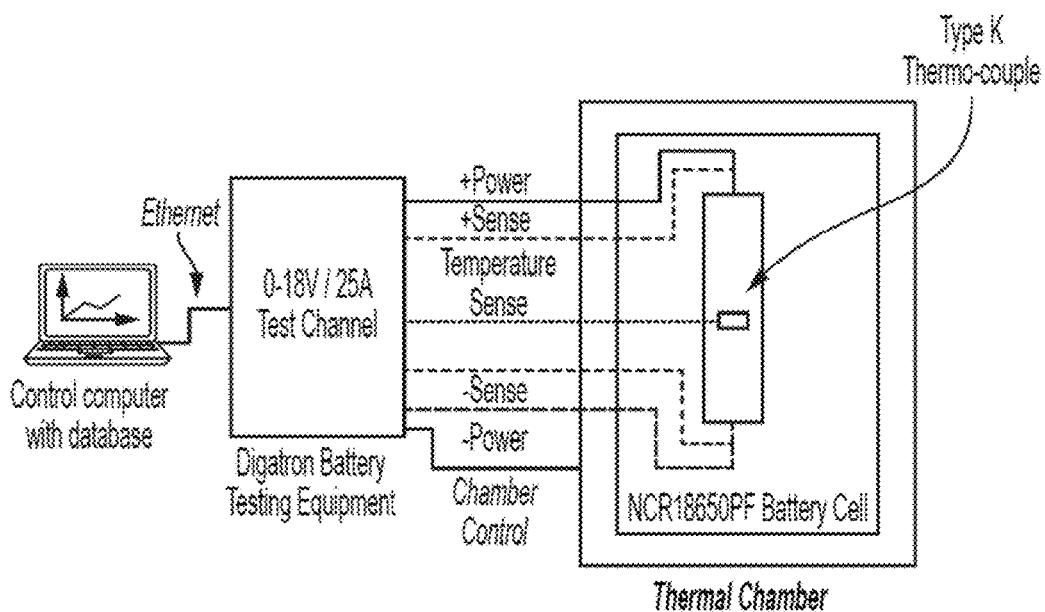

To generate training and validation data for the recurrent neural network, the battery was exposed to a selection of drive cycles at ambient temperatures ranging from 0 to 25° C. A set experimental procedure was used, as is described in FIG. 4*b*). A schematic of the experimental apparatus is shown in FIG. 4*c*). The thermal chamber was first set to 25° C. followed by a three hour pause to allow the battery's internal temperature to reach 25° C. The battery was then fully charged with a constant current charge rate of 2.9 A (1 C) followed by a constant voltage charge at 4.2 V, which was terminated when current fell below 50 mA. The thermal chamber temperature was then set to the desired ambient temperature to record the subsequent drive cycle, and, in turn, this was paused for three hours again to allow the battery's internal temperature to reach steady state. The battery is then discharged using a drive cycle power profile which includes regenerative braking (i.e. charging) power if the ambient temperature is greater than or equal to 10° C., the minimum temperature for which the battery is rated to charge. The current sensor that is used to measure current and to calculate capacity has an error of less than 25 mA. For the typical dataset, this sums to a cumulative error of under 40 mAh which is small compared to the 2900 mAh of battery capacity.

Figure 5:
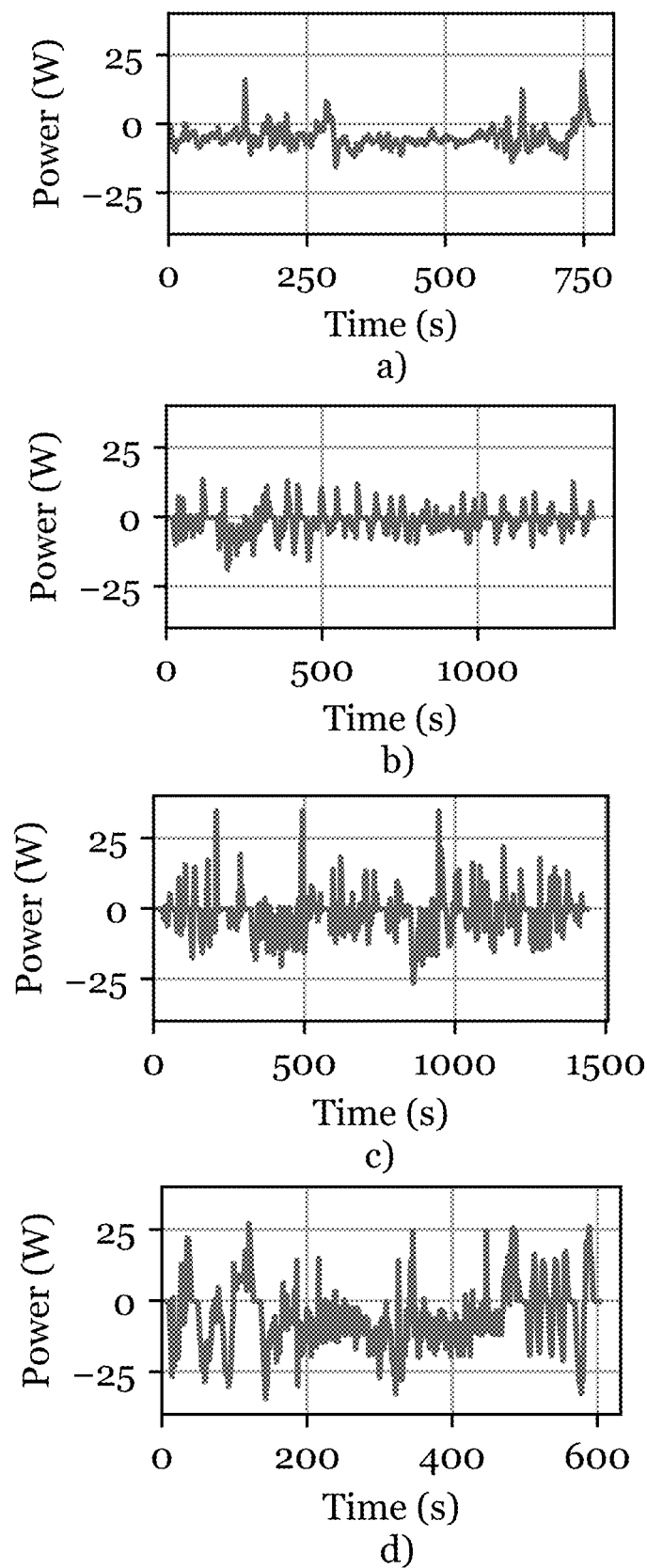
FIG. 5 is a set of graphs of drive cycle power profiles, scaled for a single cell of 35 kWh pack for a Ford F150 electric truck: a) HWFET, b) UDDS, c) LA92, d) US06.

During experimentation, the battery was exposed to 10 drive cycles. Each dataset consisted of a random combination of different drive cycles which included HWFET, UDDS, LA92 and US06. Constructing these unique datasets which were composed of various drive cycles, having a spectrum of different dynamics, provided the LSTM-RNN with a broad range of realistic driving conditions. These 10 cycles were applied on the battery at three different ambient temperatures (0, 10, or 25° C.). Training of the LSTM-RNN is performed on a subset of these 10 cycles (typically 8 to 9 cycles) and will henceforth be referred to as the training data while validation is performed on a completely different subset of cycles (usually 1 or 2) which are henceforth referred to as test cases. An additional test case, called the Charging Test Case, is recorded at 25° C. to examine the network's performance over a charging profile. Furthermore, a second additional test case is recorded during experimentation which exposes the battery cell to an ambient temperature increasing from 10 to 25° C. and is used to validate the LSTM-RNN's ability to adapt to a varying temperature. The drive cycle power profiles used are for an electric Ford F150 truck [Kollmeyer, 2015, Kollmeyer et al., 2012], with the power profile scaled for a single cell of a 35 kWh pack consisting of 3,680 of the Panasonic NCR18650PF cells. The power profile for the drive cycles has discharge power (negative power) as great as 40 W per cell and charge power (positive power) as great as 35 W per cell, as is shown in FIG. 5. This translates to peak current of around 18 A, or 6 C, which is a fairly typical peak C-rate for an electric vehicle application. The power profile is repeated until the battery's usable capacity is depleted. This is defined as 2.61 Ah when discharged at an ambient temperature of 25° C., 2.5 Ah at 10° C. and 2.32 Ah at 0° C.

Figure 6:
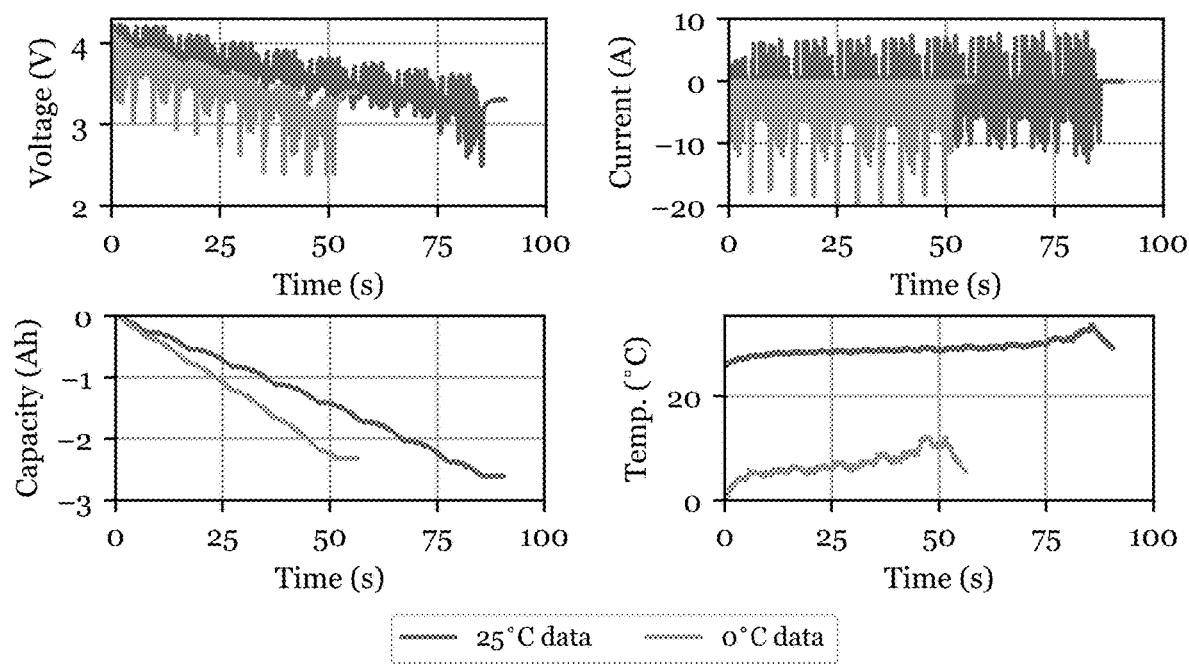
FIG. 6 is a set of graphs for a US06 drive cycle recorded at an ambient temperature of 25° C. and 0° C.

The measured voltage, current, amp-hours, and battery surface temperature are shown in FIG. 6 for the US06 drive cycle at an ambient temperature of 25° C. and 0° C. At 25° C. the current is relatively low, ≤C, and the battery voltage drop is not too significant. The temperature, measured at the surface of the cylindrical cell with a thermocouple, increases by a few degrees over the first 70 minutes of the drive, and then spikes to 34° C. as the terminal voltage falls, resistance increases, and the loss therefore increases. At 0° C., the battery resistance is much higher, resulting in significant voltage drop as is shown in FIG. 6. The higher resistance coupled with no regenerative braking energy due to the low temperature state, results in the drive cycle being repeated for 50 minutes at 0° C., while this was repeated for 85 minutes at 25° C. The battery also heats significantly, up to 13° C., due to the higher loss at low temperature.

Although the example LSTM-RNN tested is trained on data obtained from a Panasonic 18650PF cell, the same LSTM-RNN can be trained on any other type of battery cell. The network architecture does not need to change from one battery cell to another. The network might need to be retrained for a completely different battery, but it's architecture and the values of the network hyperparameters, like the learning rate, can remain the same.

As mentioned above, the vector of inputs fed into the LSTM-RNN is defined as $\Psi_k=[V(k), I(k), T(k)]$, where $V(k)$, $I(k)$, $T(k)$ are the voltage, current and temperature measurements of the battery at time step k, respectively. The mixed drive cycles were logged at a sampling frequency of 1 Hz and they ranged roughly between 4000 and 10000 seconds long. The following two subsections investigate the LSTM-RNN's SOC estimation accuracy when trained on a dataset recorded at a constant ambient temperature and at variable ambient temperatures, respectively.

SOC Estimation at Fixed Ambient Temperature

In this section, the network is trained on up to 8 mixed drive cycles while validation is performed on 2 discharge test cases. In addition, a third test case, called the Charging Test Case, which includes a charging profile is used to validate the networks performance during charging scenarios. In addition, the regenerative braking which results in charging currents of over 8 A, as can be seen from FIG. 6, allows us to test the network's performance at higher momentary charge rates. Regenerative braking charging current is not included for validation test cases recorded at the lower temperatures since the battery is not rated to charge at temperatures below 10° C. Celsius. In the Charging Test Case, charging is performed at 1 C (2.9 A). There was interest in examining an even faster charge rate, but the 1 C rate is already twice the datasheet's recommended charge rate so rates that are any higher than this are considered excessive and potentially dangerous. The LSTM-RNN's hidden layer has 500 computational nodes. A smaller number of computational nodes are possible, however the network can converge to a solution much quicker with a larger number of nodes while using a GPU. The computational time needed to train this network is about 4 hours.

The MAE achieved on each of the first two test cases is 0.807% and 1.252%, respectively. The MAE, RMS, STD-DEV and MAX performance metrics for these three test cases are outlined in the table below.

| Test Case | MAE (%) | RMS (%) | STDDEV (%) | MAX (%) |
|---|---|---|---|---|
| Test Case 1 at 10° C. * | 0.807 | 1.075 | 0.710 | 2.819 |
| Test Case 2 at 10° C. * | 1.252 | 1.541 | 0.898 | 4.312 |
| Charging Test Case at 25° C. ** | 0.688 | 0.856 | 0.510 | 4.000 |

Figure 7:
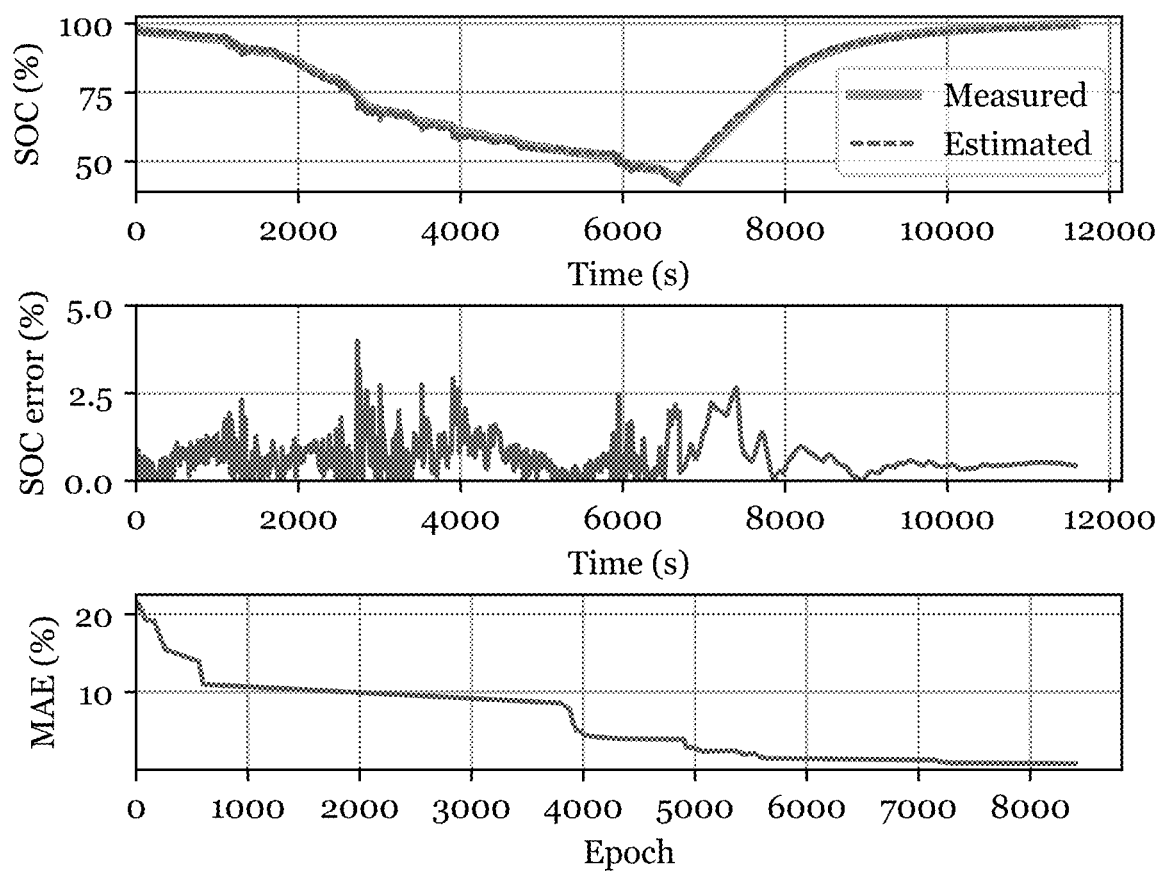
FIG. 7 is a set of graphs of performance on the Charging Test Case.

\* Results obtained with network having a depth in time of $\tilde{N} = 500$
\*\* Results obtained with network having a depth in time of $\tilde{N} = 1000$ The LSTM-RNN also showed good performance when tested on the Charging Test Case where the MAE and MAX achieved is 0.688% and 4.000%, respectively. The estimation performance on the Charging Test Case is shown in FIG. 7. At the final training epoch, the error at every time step of the test case is shown in subplot 2. Also, at every training epoch, these errors over time are used to calculate the MAE. Therefore, a plot of MAE as a function of training epoch is shown in subplot 3.

Figure 8:
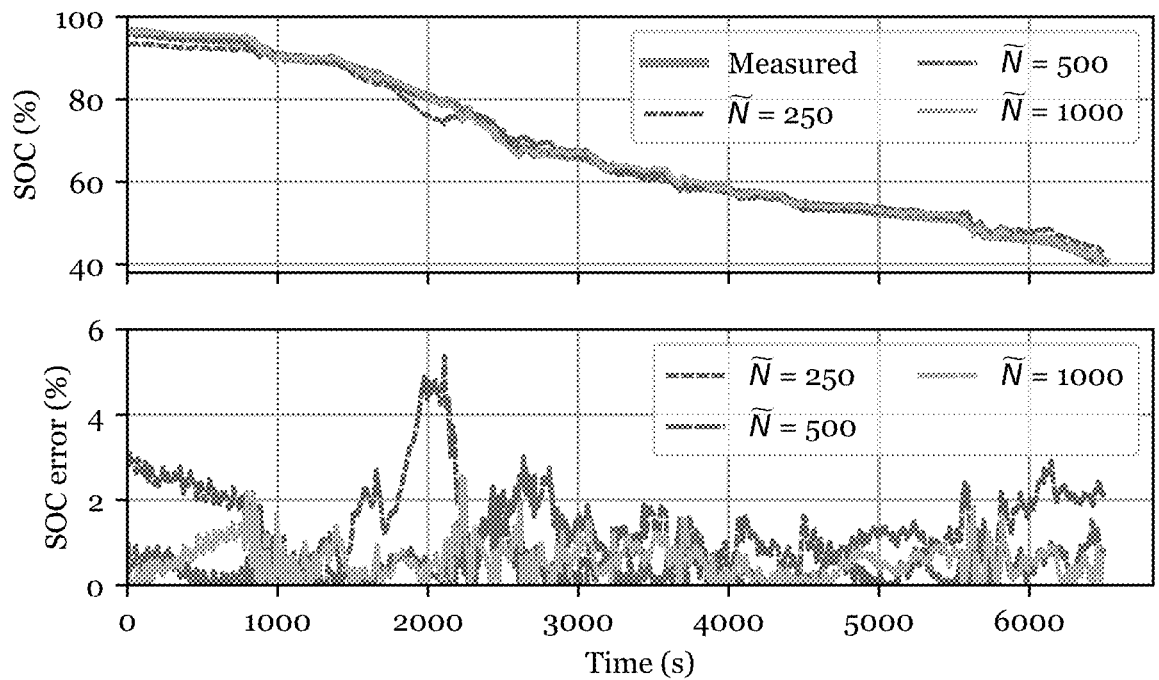
FIG. 8 is a set of performance graphs.

Various tests illustrate the factors which influence the LSTM-RNN's estimation performance and to further validate this estimation strategy. In the first test, three LSTM-RNNs having different depths in time were trained, i.e. where N 250, 500 and 1000 at an ambient temperature of 10° C. The estimated SOC and the error over time of these different LSTM-RNNs are shown in FIG. 8 and their performance metrics are outlined as follows:

| Network Depth in Time (N) | MAE(%) | RMS(%) | STDDEV(%) | MAX(%) |
|---|---|---|---|---|
| 250 | 1.303 | 1.670 | 1.043 | 5.380 |
| 500 | 0.672 | 0.863 | 0.293 | 3.015 |
| 1000 | 0.573 | 0.690 | 0.148 | 2.569 |

Networks trained on data recorded at ambient temperature of 10° C.

To maintain an unbiased comparison between the network architectures tested, training is stopped at 15000 epochs in each case. It is observed that the networks having larger depths in time which are exposed to more historical data perform better than those exposed to a smaller amount of historical data. However, the increase in estimation accuracy is not linearly proportional to depth in time since going from $\tilde{N}=250$ to $\tilde{N}=500$ reduces the MAE by about a half however, going from $\tilde{N}=500$ to $\tilde{N}=1000$ offers only a 15% reduction in MAE.

Figure 9:
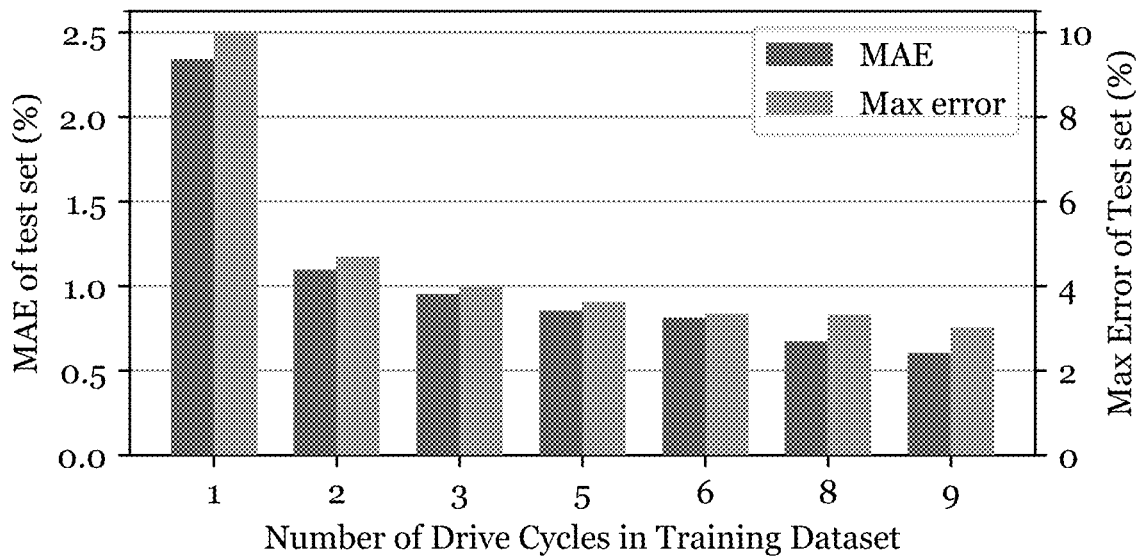
FIG. 9 is a plot of performance for different amounts of training data.

Another test is performed to measure the amount of training data needed to achieve good estimation accuracy. Therefore, instead of training the LSTM-RNN on a training dataset composed of 8 concatenated mixed drive cycles, as done to achieve the results in the first table above, FIG. 7, FIG. 8 and the table above, we record the estimation accuracy of LSTM-RNNs trained on different numbers of mixed drive cycles. This is shown in FIG. 9, where LSTM-RNNs are trained on one to nine mixed drive cycles and the MAE and max error measured over Test Case 1 are plotted in a bar graph. The more training data the network was exposed to, the more accuracy was achieved, however after a certain amount of training data (6-8 drive cycles), diminishing returns are obtained. Interestingly, the LSTM-RNN is able to achieve a MAE of below 1% when training is conducted on 3 or more drive cycles. This can be very advantageous since the LSTM-RNN can learn it's network parameters and achieve accurate SOC estimates after being exposed to relatively small amounts of training data.

Figure 10:
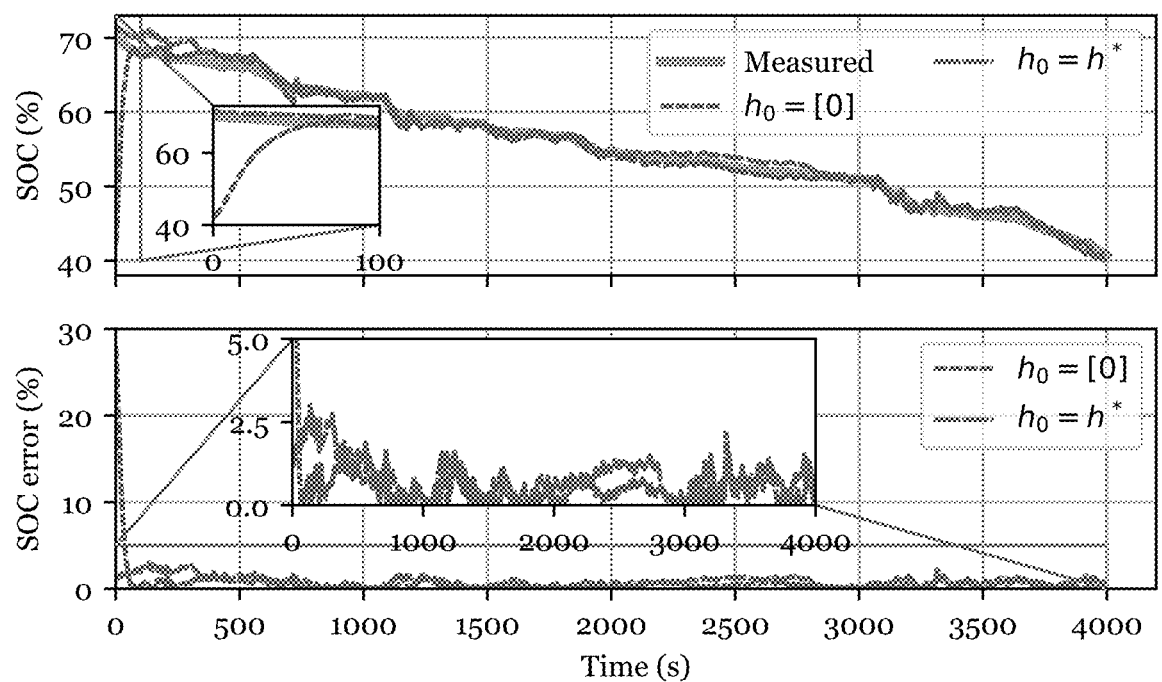
FIG. 10 is a pair of corresponding graphs of performance with correct and incorrect initialization.
Figure 11:
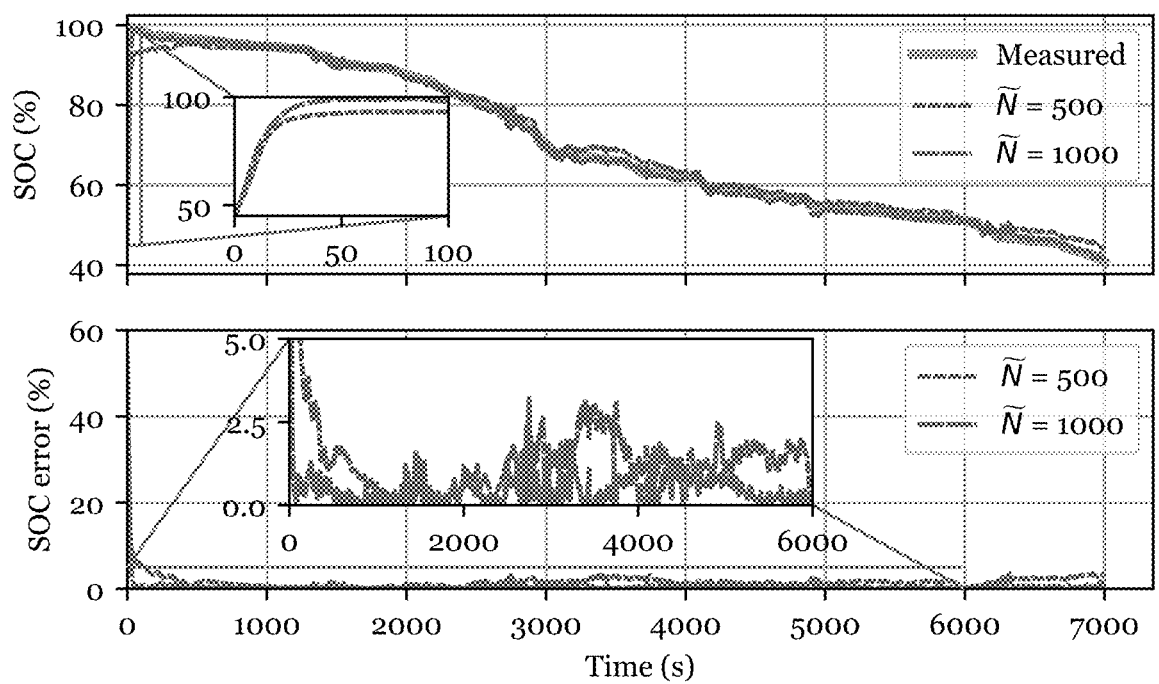
FIG. 11 is a set of graphs of performance with incorrect initialization.

Two additional tests are conducted to examine the LSTM-RNN's performance when either an incorrect initialization is given to the network or when the test drive cycle begins at different SOC levels. Giving an LSTM-RNN an incorrect initialization requires setting the hidden layer state at time step k=0 to zero. This is the only way to test for the case of incorrect initialization since the input vector given to the LSTM-RNN at every time step includes V(k), I(k) as well as T(k). SOC at time step k−1 or older are not used as feedback to the network. When correctly initialized, where $h_0=h^*$, an LSTM-RNN achieves good performance with MAE=0.776% on Test Case 1 which begins at SOC=70%, shown in FIG. 10. When given an incorrect initialization, where $h_0=0$, the LSTM-RNN struggles to estimate SOC at the start of the drive cycle (SOC=70%), where the error is about 27%, but quickly converges to a good state-of-charge estimate within the first 70 seconds of the drive cycle. Further validation is performed on this front by examining whether an LSTM-RNN that is deeper in time can converge quicker if given an incorrect initialization. This is shown in FIG. 11 where two LSTM-RNNs, one having depth in time of $\tilde{N}=500$ and the other having $\tilde{N}=1000$, are tested with incorrect initialization on Test Case 1 beginning at a SOC of 100%. It's clear that the LSTM-RNN which has a depth in time of $\tilde{N}=1000$ seconds converges in less than 50 seconds which turns out to be faster than the LSTM-RNN having $\tilde{N}=500$.

SOC Estimation at Varying Ambient Temperatures

A LSTM-RNN is constructed to handle a larger training dataset which is composed of 27 drive cycles. These 27 drive cycles include three sets of 9 drive cycles; each set is recorded at 0° C., 10° C. and 25° C. Another different mixed drive cycle, which is not a part of the training data, is used as a test case to validate the network's performance at each temperature. In particular, there are two goals that we desired to achieve within this second study. The first is to train the LSTM-RNN on datasets recorded at more than one ambient temperature such that one single LSTM-RNN can estimate SOC at different ambient temperature conditions. The second goal is to examine the LSTM-RNN's capability to interpolate its ability to estimate SOC at ambient temperatures different than the ones on which it was trained. The LSTM cell used in this study is unrolled for $\tilde{N}=1000$ time steps and the time required to train this network is about 9 hours.

Figure 12:
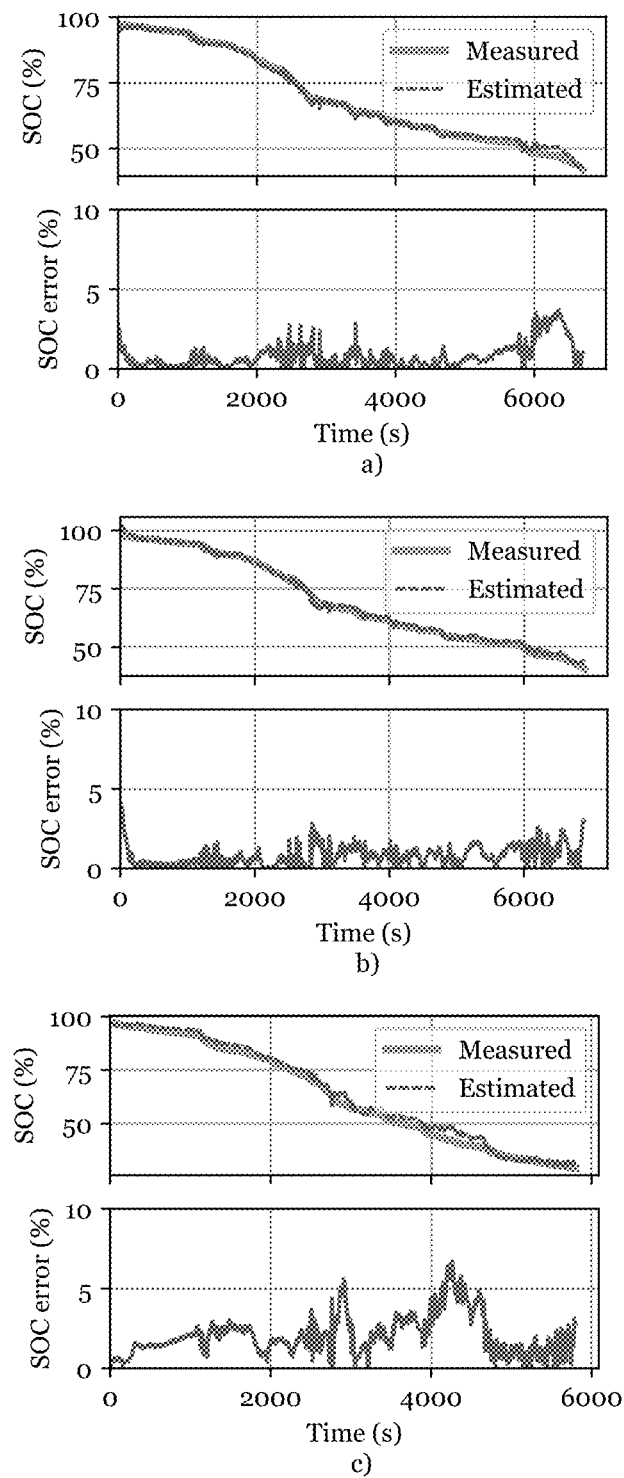
FIG. 12 is a graph of performance on Test Case 1.

The estimation performance of this single LSTM-RNN is shown in FIG. 12 where estimation performed at 25° C., 10° C. and 0° C. are plotted in a), b) and c), respectively. The MAE achieved at these three ambient temperatures is 0.774, 0.782 and 2.088. The MAE, RMS, STDDEV and MAX metrics achieved over all three ambient temperatures are outlined in the following table:

TABLE 1

SOC estimation accuracy of LSTM-RNN trained on multiple ambient temperature data

| Ambient Temperature | MAE (%) | RMS (%) | STDDEV (%) | MAX (%) |
|---|---|---|---|---|
| 25° C. | 0.774 | 1.110 | 0.796 | 3.692 |
| 10° C. | 0.782 | 0.995 | 0.616 | 4.047 |
| 0° C. | 2.088 | 2.444 | 1.270 | 6.687 |
| Varying Temperature | 1.606 | 2.038 | 1.256 | 5.815 |

The performance is good and validates the LSTM-RNN's ability to encode the dynamics experienced by a Li-ion battery at various ambient temperatures into the parameters of a single network.

Figure 13:
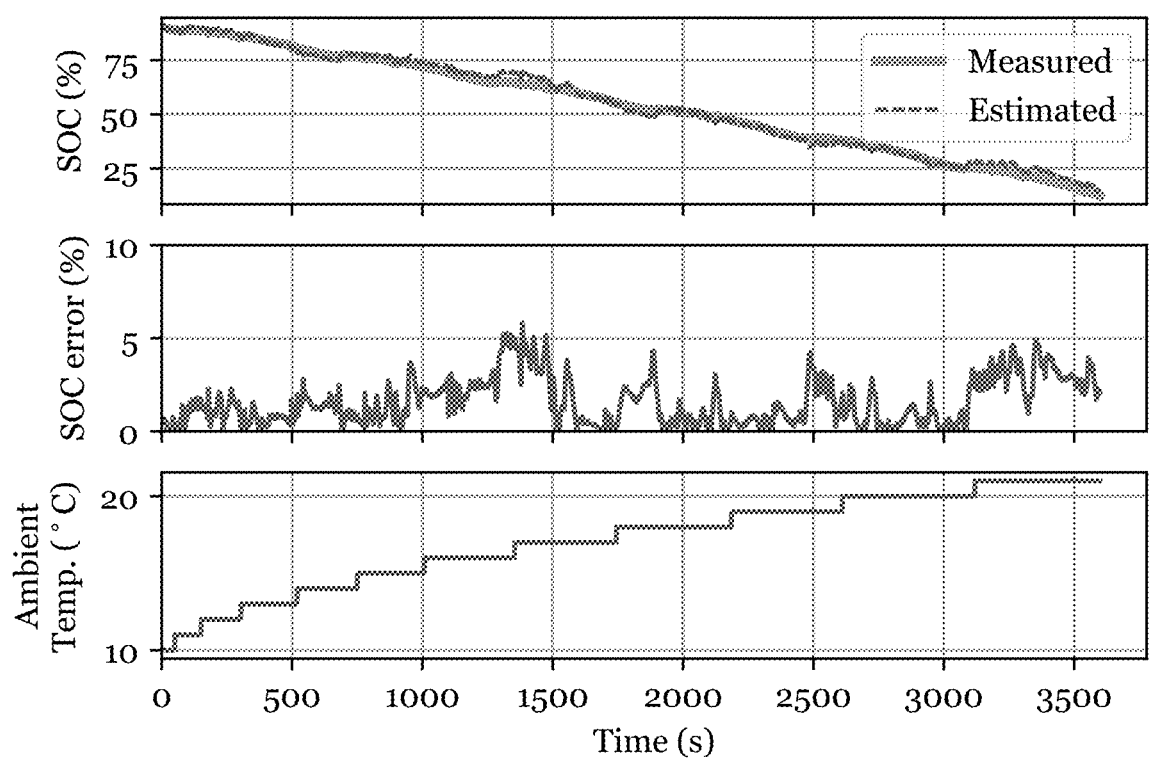
FIG. 13 is a set of graphs of performance with rising ambient temperature.

The single LSTM-RNN performed well for estimation on the validation test cases recorded at three different constant ambient temperatures however, battery-powered vehicles can undergo a change in ambient temperature of more than 10° C. over the course of one day depending on the climate or the geographical location within which they operate. Hence, an interesting test is to examine its performance on a test case, not included in the training data, which is recorded at a changing ambient temperature. Therefore, the LSTM-RNN's performance over a test case where the ambient temperature in the thermal chamber is increased from 10° C. to about 25° C. is shown in the table above, and in FIG. 13. The MAE achieved on this test case is 1.606% and showcases the LSTM-RNN's ability to perform estimation at ambient temperatures between 10° C. and 25° C. to which it is not exposed during the training process. This can be a great advantage if training data is scarce.

2 State-of-Heath Estimation Using a Convolutional Neural Network

In other embodiments Convolutional Neural Networks (CNNs) are used to estimate State-of-Health (SOH). Such embodiments have noteworthy attributes, including one or more of the following:

1. A CNN is used to map raw battery measurements directly to SOH without the use of any physical or electrochemical models. The model expressibility and performance of the CNN is not limited by knowledge of the underlying electro-chemical processes. This is the case for many traditional techniques using physical or electrochemical models where increasing model expressibility requires additional parameters representing processes like self-discharge, solid lithium concentrations, etc.
2. A data augmentation technique is used to generate the training data used as inputs to the CNN. This not only robustifies the CNN against measurement noise, offsets and gains but also increases the CNN's SOH estimation accuracy.
3. To further increase the CNN's practicality in real word applications, the CNN is trained to estimate SOH over partial charge profiles having varying ranges of State-of-Charge (SOC). This is an important feature increasing the practicality of this method considerably.

Figure 14:
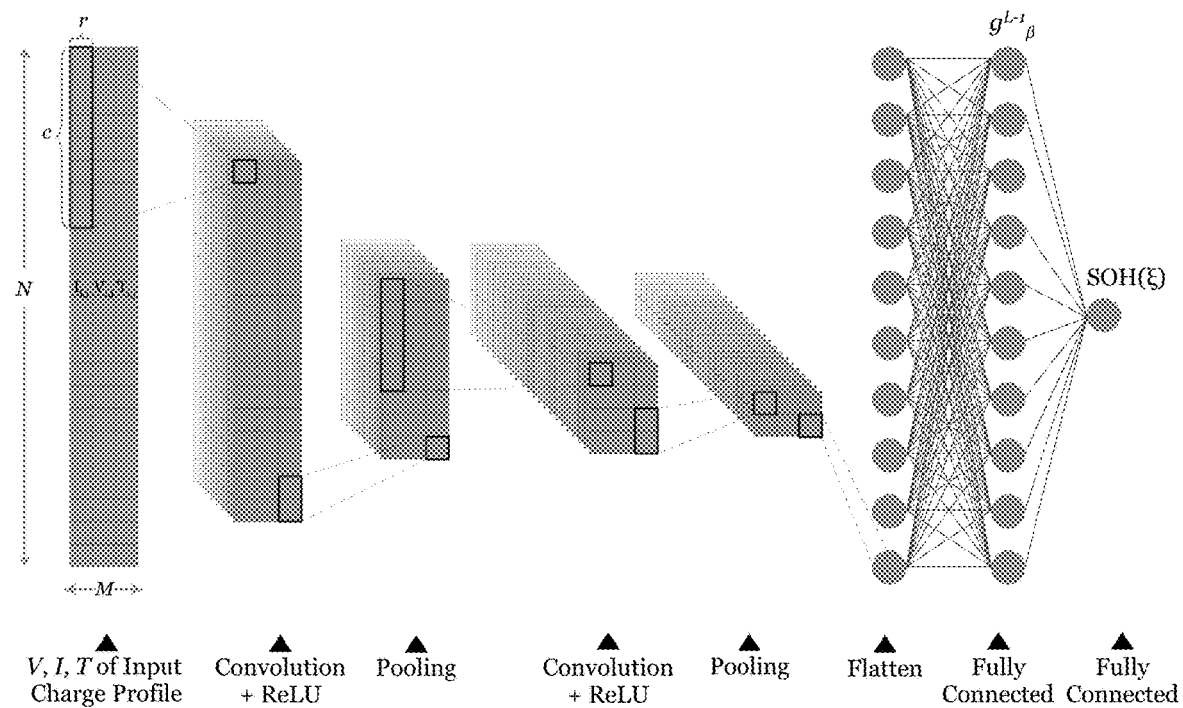
FIG. 14 is a convolutional neural network

Convolutional neural networks, such as the example shown in FIG. 14, are particularly good at mapping a set of measured quantities to a desired output, given higher dimensional datasets having inherent dependencies between adjacent dimensions. The CNNs used in this work convolve filters over the input passing the result to the next layer instead of fully interconnected adjacent layers as is typically done in fully connected neural networks. Convolving filters over the two dimensional dataset, allows these networks to benefit from shared weights and an invariance to local distortions. The CNN's filters look at data from multiple time steps during a convolution operation which would include the data point at the present time step as well as some amount of historical data points. Because of shared weights, CNNs can be given a large number of input data and its size (i.e., the number of parameters) does not increase as much as fully connected neural networks. Once the CNNs are trained offline, they offer fast computational speeds onboard a mobile device or vehicle because they are formulated by a series of convolution and matrix multiplication operations, which are great candidates for parallel computing. The typical dataset used for training and validation in this work is given by $$D=\{(\Psi(\xi_1), SOH^*(\xi_1)), \ldots, (\Psi(\xi_\Xi), SOH^*(\xi_\Xi))\} \quad (5)$$

where $\Psi(\xi)$ and $SOH^*(\xi)$ are the array of input data and the ground-truth state-of-health value, respectively, for each charge profile, $\xi$. The input for a charge profile, $\Psi(\xi) \in \mathbb{R}^{N \times M}$, which is discussed further below, can be composed of battery measurements like current, voltage and temperature and, in the case of partial charge profiles, they also include the SOC values.

The kernel, $w^{lkm}$, used in each layer of the CNN having height $C_l$ and width $R_l$, are convolved over the input array of height $N_{l-1}$ and width $M_{l-1}$. For a more formal description, consider the element $x_{ij}^{lk}(\xi)$ at location (i,j) in the kth feature map of layer l for charge profile $\xi$, given as follows:

$$x_{ij}^{lk}(\xi) = \eta(\Sigma_m \Sigma_{c=0}^{Cl-1} \Sigma_{r=0}^{Rl-1} (w_{rc}^{lkm} h_{i+c,j+r}^{l-1,m}(\xi) + b^{lk}))$$

$$h^{lk}(\xi) = S(x_{lk}(\xi)) \quad (6)$$

where, $$\eta = \max(0, y) \quad (7)$$

In the above composite function, m is the feature map in layer l−1, $b_{lk}$ is the bias for feature map k in layer l and $w_{rc}^{lkm}$ is the value of the kernel at the (c, r) location. S(•) is a sub-sampling function, called max-pooling, which gives the maximum value of a perceived subsets of a feature map, where $s \subseteq h^{lk}$.

The non-linearity used in this work, $\eta$, is referred to as the Rectified Linear Unit (ReLU). This is used in this work due to its simplicity and ease of implementation in real time. The last few layers of a CNN, as observed in FIG. 14, are fully-connected layers, formally described as follows:

$$g_\beta^l(\xi) = \eta\left(\sum_\beta (\omega_{\alpha\beta}^1 h_\beta^{l-1}(\xi) + b_\beta^1)\right) \quad (8)$$

where, $$g_\beta^l(\xi) = SOH(\xi), \text{ for } l = L \quad (9)$$

and where $\omega_{\alpha\beta}^1$ denotes the weight connection between neuron a in the (l−1)th layer and neuron $\beta$ in the lth layer, $b_\beta^1$ and $h_\beta^l$ are the bias and activation function at layer l, respectively. The total number of layers in the CNN is given by L. To determine the SOH estimation performance of the CNN for a particular charge curve $\xi$, the estimated state-of-health, SOH($\xi$), is compared to the state-of-health ground-truth value, $SOH^*(\xi)$, resulting in an error value. The loss function is simply the mean squared error computed from all the individual errors, as follows:

$$\mathcal{L} = \frac{1}{\Xi}\left(\sum_{\xi=0}^{\Xi}((SOH(\xi) - SOH^*(\xi))^2)\right) \quad (10)$$

where $\Xi$ is the total number of charge curves in the training dataset.

One full training epoch, $\epsilon$, describes a single cycle of one forward pass and one backward pass. In this work, training does not cease till a specified threshold criteria of loss is attained. In addition, the gradient of the loss function with respect to the weights is used to update the network weights in an optimization method called Adam [Kingma and Ba, 2014]. This is given in the following composite function;

$$u_\epsilon = \gamma_1 u_{\epsilon-1} \nabla \mathcal{L}(\omega_{\epsilon-1})$$
$$v_\epsilon = \gamma_2 v_{\epsilon-1} \nabla \mathcal{L}(\omega_{\epsilon-1})^2$$
$$\tilde{u}_\epsilon = u_\epsilon(1 - \gamma_1^\epsilon)$$
$$\tilde{v}_\epsilon = v_\epsilon(1 - \gamma_2^\epsilon)$$
$$\omega_\epsilon = \omega_{\epsilon-1} - p\frac{\tilde{u}_\epsilon}{\tilde{v}_\epsilon - \kappa}$$

(11)

where $y_1$ and $y_2$ are decay rates set to 0.9 and 0.999, respectively, $p=10^{-5}$ is the learning rate and $\kappa$ cis a constant term set to $10^{-8}$. The network weights at the present training epoch are given by $\omega_\epsilon$. During the backward pass, the network self-learns its network weights and biases, a process referred to as backpropagation, which is a remarkable difference to other methods that demand time-consuming hand-engineered battery models and parameter identification. Validation is performed on datasets which the CNN has never seen during training.

In this example, state-of-health estimation performance is evaluated with various metrics. These include Mean Absolute Error (MAE), Root Mean Squared Error (RMS), Standard Deviation of the errors (STDDEV) and the Maximum Error (MAX).

TABLE 2

| Capacity @ SOH = 100% | Min. 2.08 Ah/Typ. 2.15 Ah |
|---|---|
| Min/Max Voltage | 3.2 V/4.2 V |
| Min/Max Temperature | 15° C./43° C. |
| Charge Current (CC) | 2.0 A |
| Random Walk Current | Min. −4.5 A/Max. 5.0 A |

A dataset used to evaluate the approach include the Randomized battery Usage Dataset obtained from the NASA Prognostics Center of Excellence [Bole et al., 2014]. The parameters of most of these datasets are shown in Table 2. 28 LG Chem 18650 Li-ion cells are aged by undergoing a randomized load; ranging between 0.5 A and 5 A for some datasets and −4.5 A to 4.5 A for others, often at different ambient temperatures. Each random walk step last for about 5 minutes. Random usage serves as a better representation of real world loading profiles where vehicle acceleration and deceleration are unpredictable. Reference charge profiles were conducted roughly every 5 days to characterize the cell's aging. These were sampled at 0.1 Hz, although this was not always consistent, and, as is typically performed, the charge curves in these characterization steps included a constant current (CC) and constant voltage (CV). The CC segment of the charge profile was set to 2 A and typically consisted of the first 60% to 70% of the capacity at full charge.

Figure 15:
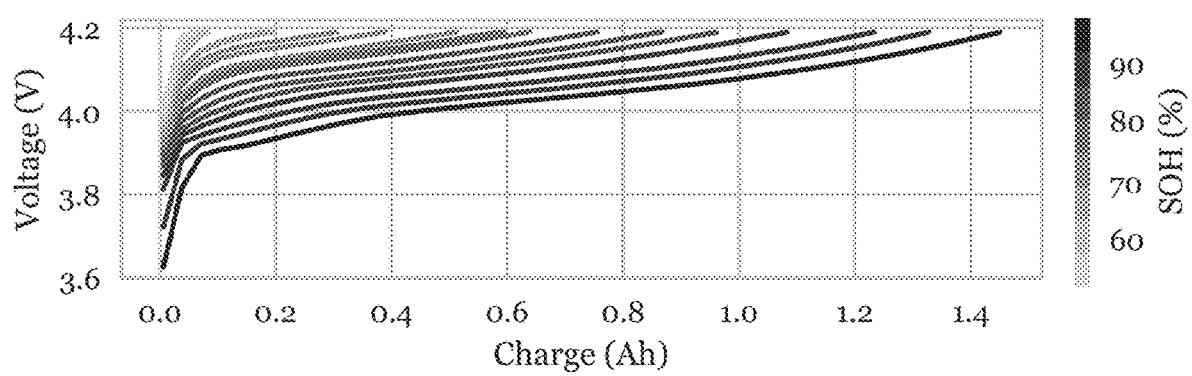
FIG. 15 is a CC segment of charge profile of a Li-ion cell throughout randomized usage aging process in which each profile has the indicated SOH.
Figure 16:
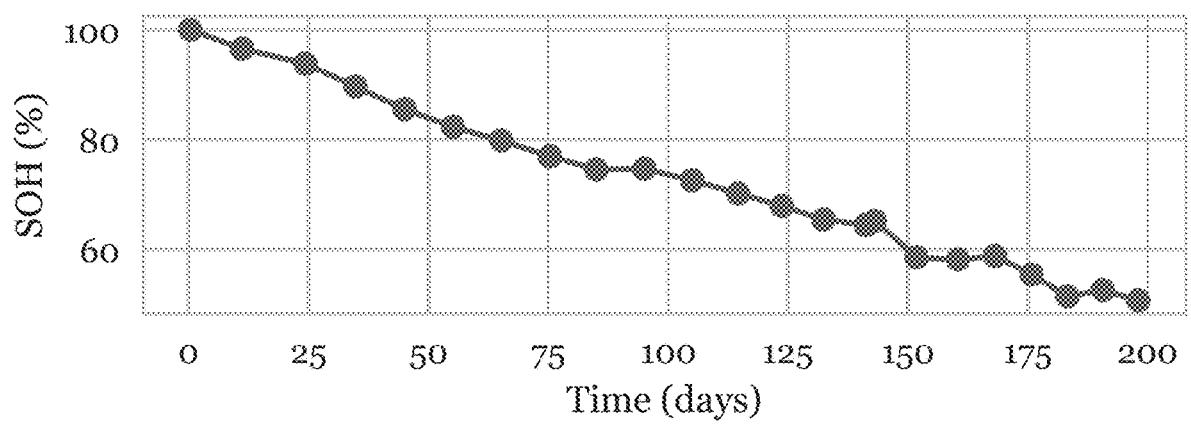
FIG. 16 is a graph of recorded capacity-based SOH for each of the charge profiles in FIG. 15.

This evaluation considers the fixed and partial SOC ranges where both the CC and the CV segments of the charge curves are utilized. For most of the 28 aging datasets in this repository, the cells are aged to at least SOH=80% and in some cases are aged to less than SOH=40%. An example of one aging dataset is shown in FIGS. 15-16.

Figure 17:
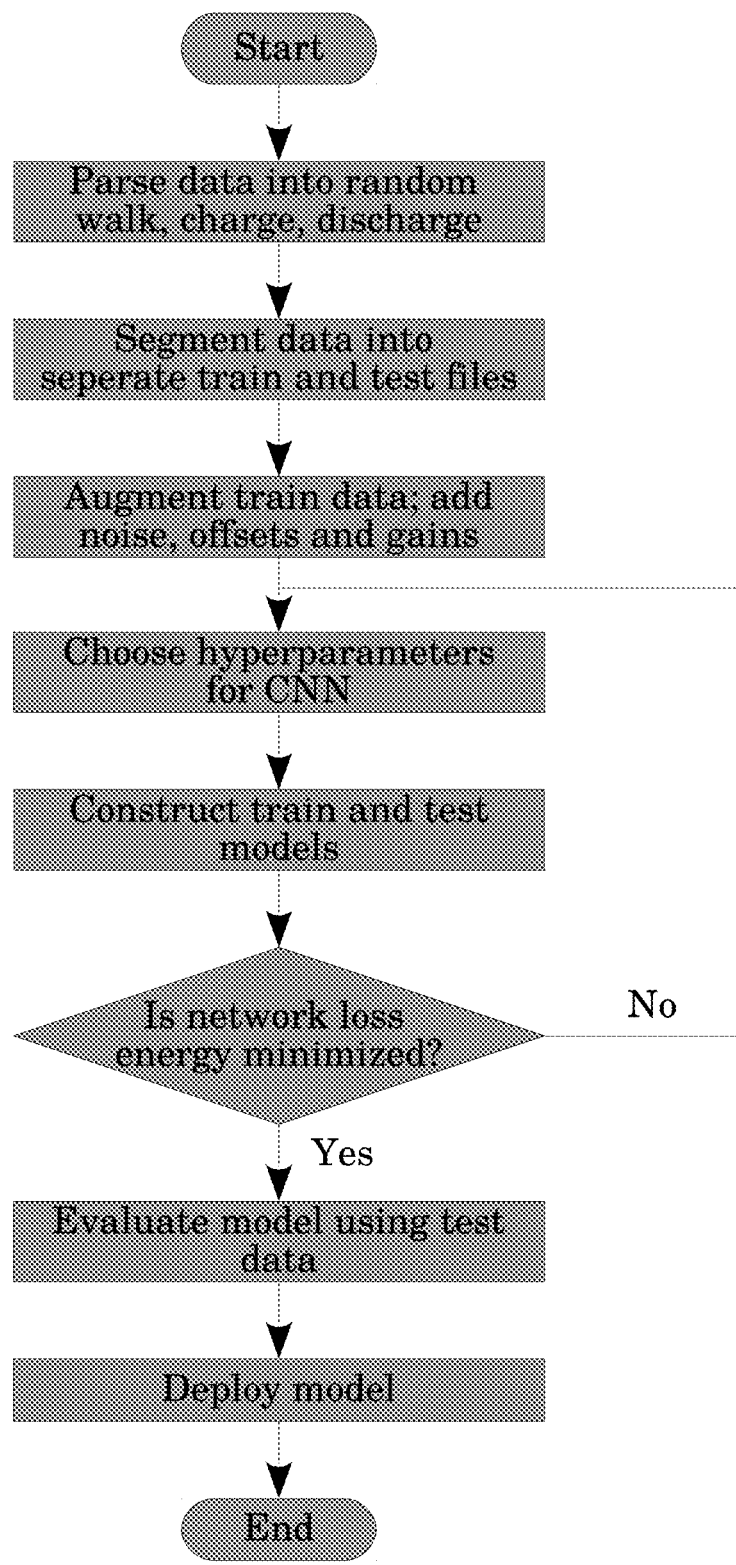
FIG. 17 is a flowchart describing data preprocessing, data augmentation and model training steps.

The entire process from data parsing to the CNN training and validation are represented in a flowchart shown in FIG. 17. The following is performed for every one of the 28 datasets of the repository. First, the reference charge profiles are extracted from the raw data. For example, dataset 1 of the 28 datasets, contains 40 reference charge profiles, spanning the entire lifetime of the aged battery cell. These are extracted and saved for the preprocessing step. Second, in the preprocessing step, the current voltage and temperature sequences of dataset 1 are resampled using linear interpolation at 0.1 Hz to ensure good discretization. The three signal sequences are concatenated together to form an array having 3 columns and 256 rows. Therefore, as shown in FIG. 14, an input reference profile is defined as $\Psi(\xi) \in \mathbb{R}^{N \times M}$ where N=256 and M=3. Although we truncate the datasets to the first 256 time steps, the reference profiles are typically at least 1000 time steps long. For the case of the partial reference profiles, not only are the first 256 time steps selected but different segments of 256 time steps are also chosen throughout the full reference profile.

The number of rows is typically longer than 256, but the rows are truncated so that all reference profiles have the same duration in time. This was done to increase data impartiality; in other words, to avoid biasing the model towards reference profiles which might have had more time steps or which had a longer time span. The reference profiles for one dataset are then all concatenated depthwise to form a three dimensional array. For example, in the case of dataset 1 containing 40 recorded reference profiles, the resulting dimensions after processing would be 256×3×40.

The data points representing current during charging are multiplied by the sampling period of 10 seconds or 0.00277778 hours which are then summed to get the resulting capacity. This calculation is performed whenever the reference profiles are observed which was roughly every 5 days. To get the ground-truth SOH, the Ah calculation from all the reference profiles is divided by the Ah calculation conducted for the first observed reference profile, before any aging is performed.

The convolutional neural network is robustified against noise, offsets and gains existent in real world measurement devices. In this example, a data augmentation technique is used by injecting Gaussian noise into the measured battery signals. Specifically, Gaussian noise with 0 mean and a standard deviation of 1-4% is injected into the voltage, current and temperature measurements. Moreover, to robustify against offsets and gains inherent in battery measurement devices, an offset is applied to all measurement signals and a gain is applied only to the current measurement since current measurements are more susceptible to gains. An offset of up to ±150 mA and a gain of up to ±3% is applied to the current measurements, an offset of up to ±5 mV is applied to the voltage measurement and an offset of up to ±5° C. is applied to the temperature measurement. Alternate copies of the training data are created with varying levels of noise, offsets and gains within the limits described above.

Before training and during the data augmentation step, up to 80 variants were created for each original dataset which would mean that 2240 datasets were used in actuality at training time. The noise, offset, and gain values used in the paper are similar to or are somewhat worse than those values seen for the typical automotive sensors. For example, a commercial grade current sensor can be typically rated for 0.5% noise on the output. A larger noise magnitude was selected in this paper than that inherent in many of these sensors for two reasons: (1) To help with the training of the network, reduce overfitting as well as to increase estimation accuracy and (2) To emulate noise which may be injected into the system due to noisy power electronics or other EMI and EMC emitting equipment in an actual vehicle.

This data augmentation technique is related to a method sometimes referred to as jittering which not only robustifies the model against measurement error but it also leads to higher estimation accuracies and reduces overfitting. After training on this augmented data, we also test the model on corrupted test data which is intentionally injected with signal error to test the CNN's robustness.

The state-of-health estimation performance of the deep convolutional networks are outlined next. As previously mentioned, this example uses charge profiles which include both fixed (beginning at SOC=0%) and partial SOC ranges (beginning at SOC>0%). There are trade-offs which need to be made in either case and these will be discussed in the following two sections. The results obtained over full reference charge profiles serve as a good baseline to which the performance over partial charge profiles can be compared. The networks discussed in this section use a learning rate of $1 \times 10^{-5}$.

Training is conducted on up to 26 of the aging datasets and validation is performed on 1 or 2 datasets, depending on the tests being performed. The validation datasets are never seen by the CNN during the training process. The time required to train the CNNs used to obtain the results in this subsection is 4-9 hours, depending on its size and depth.

TABLE 3

| Validation Dataset | MAE(%) | STDDEV(%) | MAX(%) |
|---|---|---|---|
| Validation RW dataset (25° C.) | 1.5 | 1.0 | 3.3 |
| Validation RW dataset (40° C.) | 1.2 | 0.7 | 2.4 |

L1&L2: 32@(32, 1), L3-L6: 64@(32, 1), FC1: 256 neurons

Figure 18:
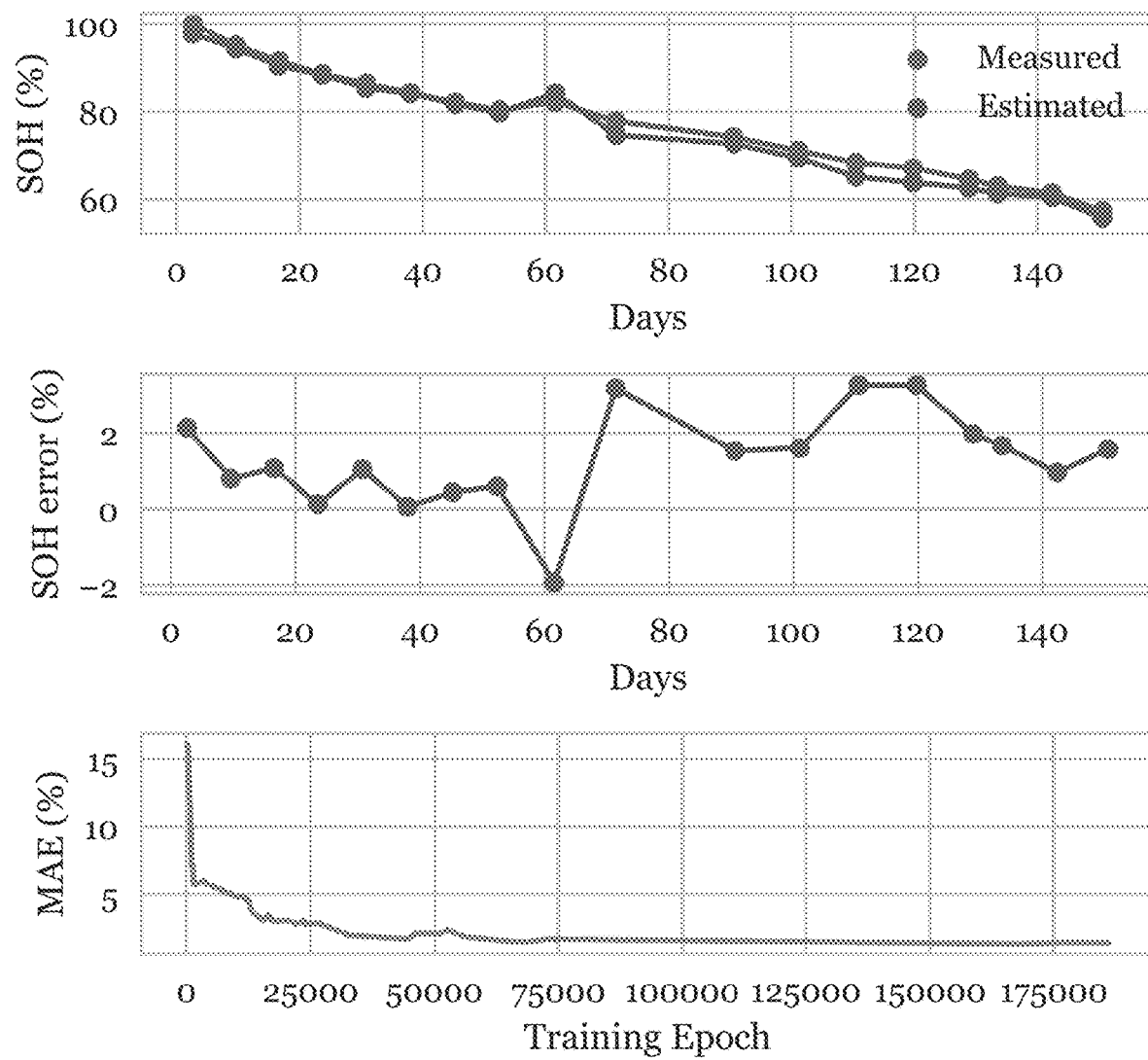
FIG. 18 is a set of graphs, from top to bottom, CNN estimation accuracy, estimation error over the 25° C. validation dataset and the mean absolute error as a function of training epochs.
Figure 19:
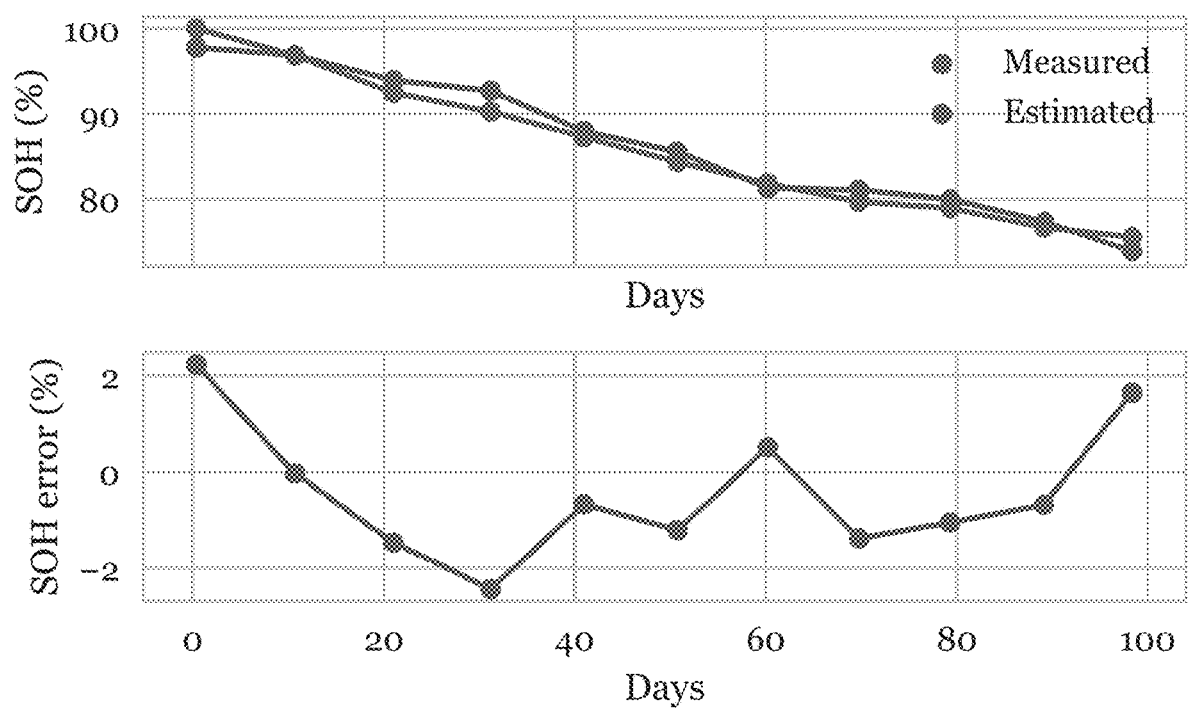
FIG. 19 is a graph of estimation accuracy and estimation error over 40° C. validation dataset.

The CNN is first validated on two aging datasets in the NASA repository, referred to as dataset RW4, recorded at 25° C., and RW23, recorded at 40° C. This CNN is composed of 6 convolution layers and 2 fully-connected layers (FC). The results, shown in FIGS. 18-19 and in Table 3, point to an MAE of 1.5% and 1.2% for the 25° C. and 40° C., respectively. The network is trained for up to 175,000 epochs.

The CNN's performance over additional test cases are shown in Table 4, where the notes in the table's footer indicate the architecture of the network. For example, L1: 32@(32, 1), indicates that the first layer is a convolutional layer having 32 filters with height 32 and width 1. In addition to the performance metrics, the number of parameters representing the networks used for each of the test cases is shown. For most of these tests training is stopped at 100,000 epochs to maintain testing objectivity. The first of such tests evaluates the CNN's accuracy for inputs which include solely voltage as compared to inputs which include battery current, voltage and temperature. The results show that the error when using only voltage as an input is satisfactory with an MAE and MAX of 1.5% and 3.9% respectively. However, the MAE and the MAX are reduced by 33% and 44%, respectively, when using all three input signals. Therefore, all three inputs are critical to minimize estimation error.

As described in equation 6 above, max-pooling, S(•), is performed after a convolutional layer to subsample the layer activations. Although this is a layer that is often used for other applications, its efficacy in SOH estimation applications was initially unknown. Therefore, to better understand this, a CNN with pooling layers is compared to a second CNN with no pooling layers.

It is found that a CNN with no pooling offers an MAE of 1.3% however a CNN with pooling has an MAE of 1.0%. Therefore, pooling improves the accuracy of the CNN for SOH estimation by about 23%.

In the third test, the impact of augmented training data described above on the estimation accuracy of the CNN was investigated. This was performed by training two identical CNNs with identical architectures over augmented and unaugmented datasets. Augmentation describes the injection of Gaussian random noise as well as offsets and gains into the training data, as described in section III. Using an unaugmented training dataset, an MAE and MAX of 2.4% and 4.2% is obtained while using an augmented training dataset, an MAE and MAX of 1.2% and 3.6% is obtained. Therefore, exposing the CNN to augmented training datasets offers good performance gains with a reduction in MAE and MAX of 50% and 14%, respectively.

Figure 20:
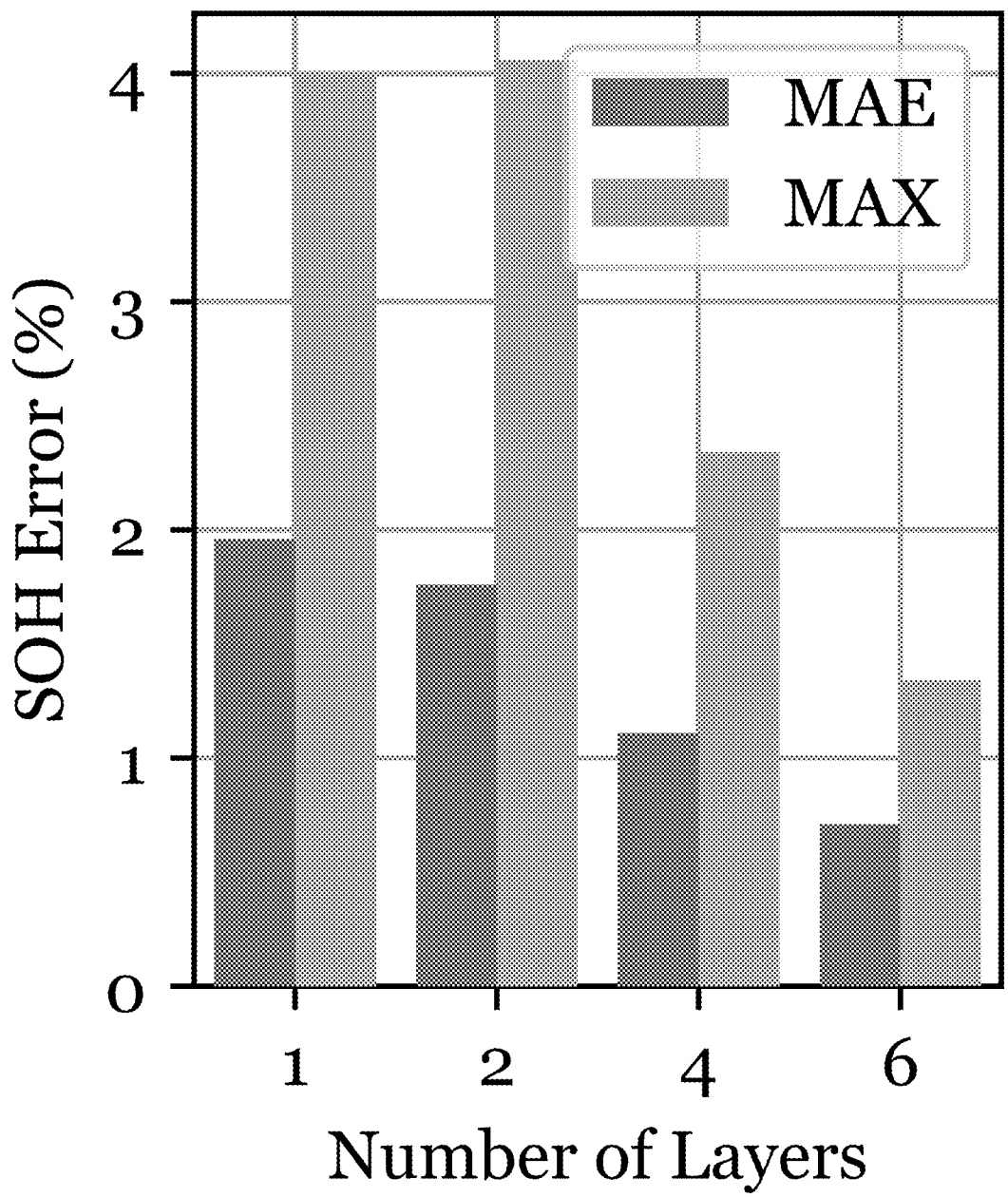
FIG. 20 is a graph of estimation accuracy over validation data versus number of layers in CNN.
Figure 21:
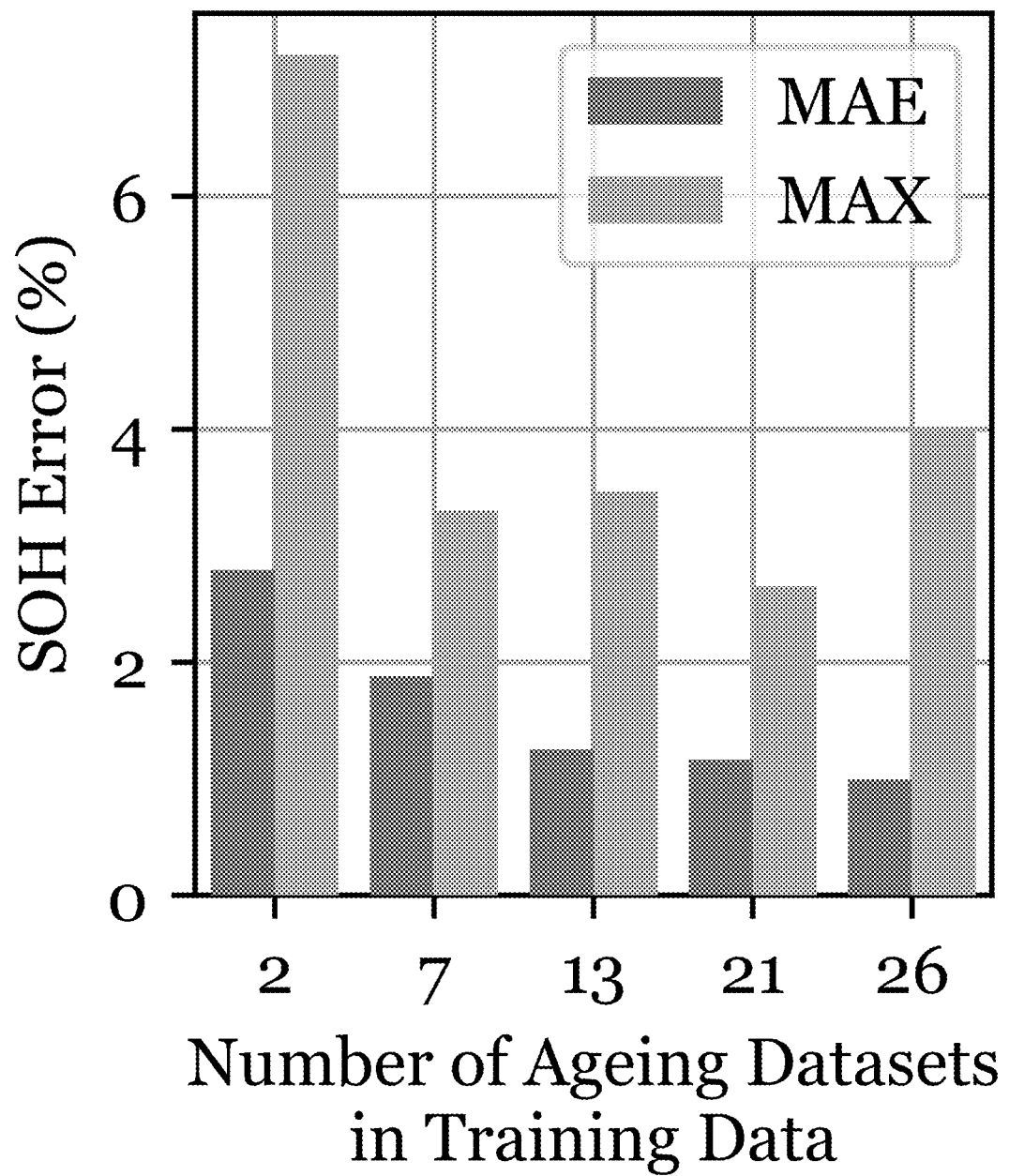
FIG. 21 is a graph of estimation accuracy measured during validation versus number of training datasets. All tests are performed over validation datasets recorded at 25° C.

In the final test case, the estimation performance was examined for a much smaller network since on-board applications often cannot allocate a large amount of computation to the SOH algorithm. Therefore, a network with only two convolutional layers is used to estimate SOH. When trained with augmented training data, the MAE and MAX achieved by this small CNN over a validation dataset is 1.9% and 6.1%, respectively. Although, this network has adequate performance, further tests are conducted to assess the impact of network depth on the CNN. In FIGS. 20-21, the accuracy of convolutional neural networks at estimating SOH is recorded, first, as a function of network depth (number of layers) and, second, as a function of the amount of training data used during the training process. Clearly, deeper networks achieve increased estimation accuracy since going from 1 convolutional layer to 6 reduces the MAE by more than 60%.

In FIG. 21, the estimation accuracy over a validation dataset is examined as a function of the amount of training data. In general, the more training data used, the more MAE is reduced. However, the argument to use more data than 13 or 21 datasets during training becomes hard to substantiate given the diminishing returns achieved when more than 21 datasets are used.

TABLE 4

| Case Study | MAE (%) | STDDEV (%) | MAX (%) | Params (Million) |
|---|---|---|---|---|
| Input: Voltage* | 1.5 | 1.1 | 3.9 | 3.8 |
| Input: Voltage, Current, Temperature* | 1.0 | 0.6 | 2.2 | 3.8 |
| No Pooling* | 1.3 | 0.8 | 3.4 | 3.8 |
| Pooling* | 1.0 | 0.6 | 2.2 | 3.8 |
| Unaugmented Train Data** | 2.4 | 1.1 | 4.2 | 3.6 |
| Augmented Train Data** | 1.2 | 1.1 | 3.6 | 3.6 |
| Smallest CNN*** | 1.9 | 1.6 | 6.1 | 0.1 |

*L1-L6: 64@(32, 1), FC1: 256 neurons
**L1&L2: 32@(32, 1), L3-L6: 64@(32, 1), FC1: 256 neurons
***L1&L2: 4@(4, 1), FC1: 32 neurons

TABLE 5

| Validation Data Corruption | MAE(%) | STDDEV(%) | MAX(%) |
|---|---|---|---|
| No | 1.4 | 0.9 | 3.2 |
| Yes* | 1.7 | 1.3 | 4.0 |

Architecture; L1-L4: 32@(31, 1), FC1: 64 neurons
*Corrupted by injection of noise, gains and offsets.

Figure 22:
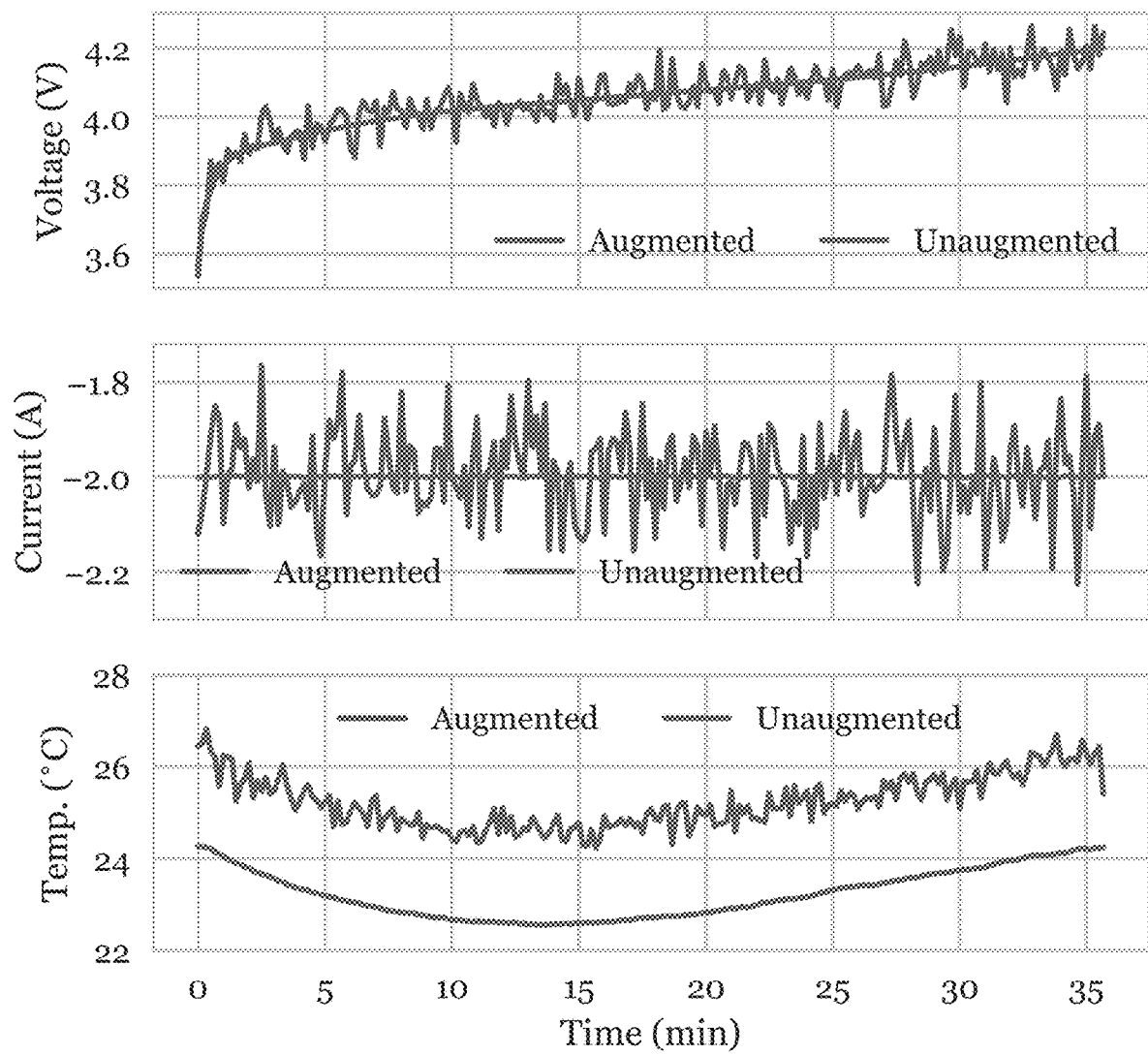
FIG. 22 is a graph of corrupted and uncorrupted voltage, current and temperature signals of validation dataset.
Figure 23:
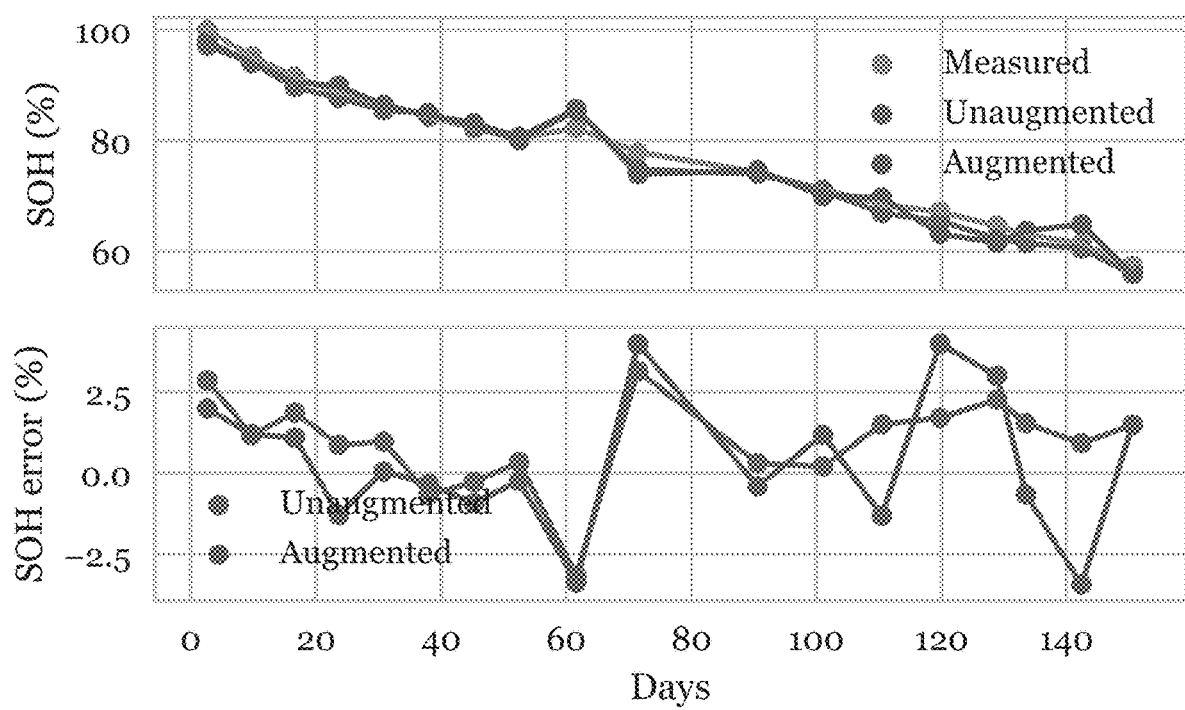
FIG. 23 is a graph of estimation accuracy and estimation error over corrupted and uncorrupted battery validation data.

Models trained on battery measurements obtained which were generated in the lab can be very sensitive to measurement noise, offsets and gains typically present in real world scenarios. Therefore, we test the robustness of the CNN by using data that is intentionally corrupted. In FIGS. 22-23 and in Table 5, the results for SOH estimation over corrupted validation data are shown. Specifically, normally distributed random noise with mean 0 and standard deviation of 1%, 1.5% and 5% is added to the voltage, current and temperature measurements, respectively. An offset of 5 mV, 50 mA and 2° C. is added to the voltage, current and temperature measurements, respectively. A gain of 2% is only applied to the current measurements. The CNN showed good robustness as performance over the corrupted validation dataset resulted in an MAE of 1.7%.

Although the CNN achieves high performance as described above, the charge profiles used are fixed, such that the SOC ranges between 0% and about 60%. As described above, batteries are typically never fully discharged down to SOC=0%. Therefore to increase the practicality of this method, the CNNs are trained over partial charge curves. However, differences between charge curves having different SOC ranges around the same SOH value can be subtle. Therefore, it becomes important to include something other than voltage, current and temperature as an input so that these subtle differences can be recognized by the CNN. Hence, SOC, which is assumed to be continuously monitored by an electric vehicle (or estimated as described using RNN above), is included as an input to the CNN. The reference profiles ranging from SOC=0% to SOC=100% are typically longer than 1000 time steps therefore it was possible to select many different 256 chunks to train on. Since the profiles are sampled once every 10 seconds, this meant that the length of each partial reference profile is about 43 minutes. It is important to note that in all the results of this subsection, all the stated ranges of the partial profiles are ranges of the new battery cell before it has aged. Although, subsequent aged partial reference profiles start at the same SOC, they will end at a slightly lower state of charge. This can also be observed from the plots in FIGS. 25 and 27.

TABLE 6

| SOC range | MAE(%) | STDDEV(%) | MAX(%) |
|---|---|---|---|
| 25%-84% | 1.6 | 1.1 | 3.6 |
| 40%-89% | 1.6 | 1.0 | 3.5 |
| 60%-92% | 0.8 | 0.7 | 2.7 |
| 85%-97% | 1.6 | 0.9 | 3.5 |

Architecture; L1&L2: 64@(31, 1), L3&L4: 64@(16, 1)

Figure 24:
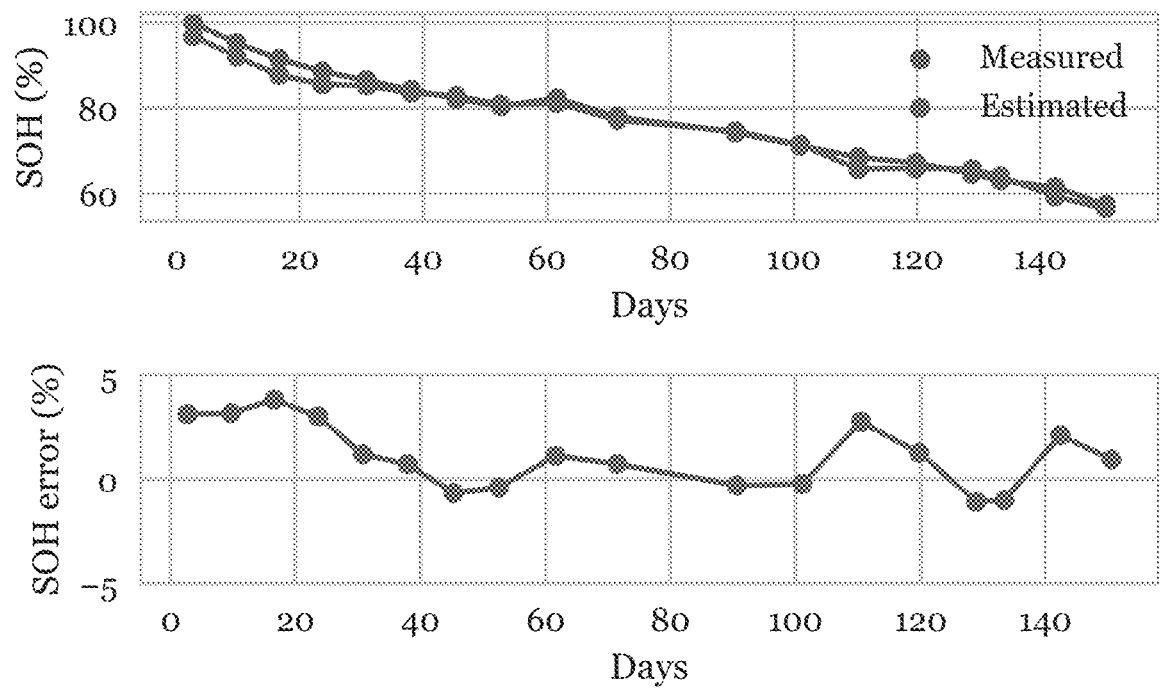
FIG. 24 is a plot showing SOH estimation results from CNN when given a partial charge profile as well as the corresponding error curve.
Figure 25:
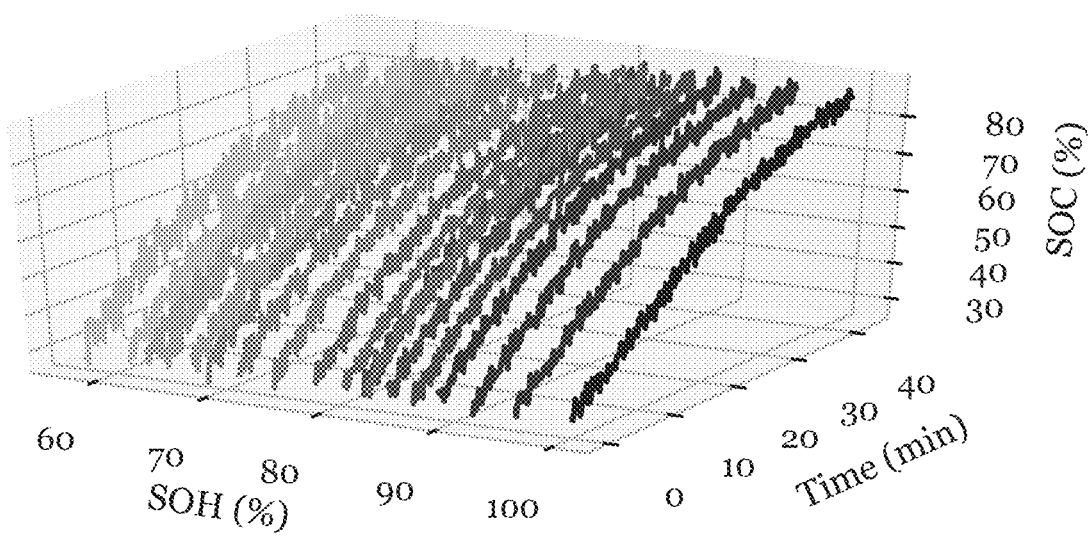
FIG. 25 is a plot of partial charge profiles beginning at SOC=30% and ending at about SOC=85%.
Figure 26:
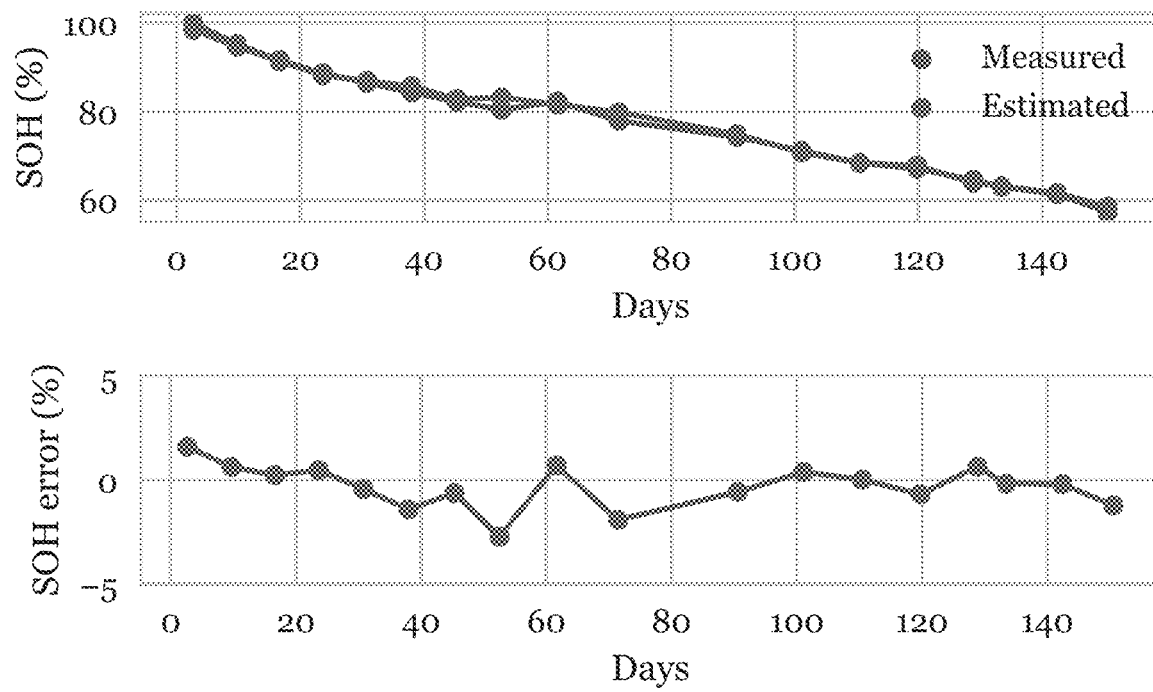
FIG. 26 is a plot showing SOH estimation results from CNN when given a partial charge profile as well as the corresponding error curve.
Figure 27:
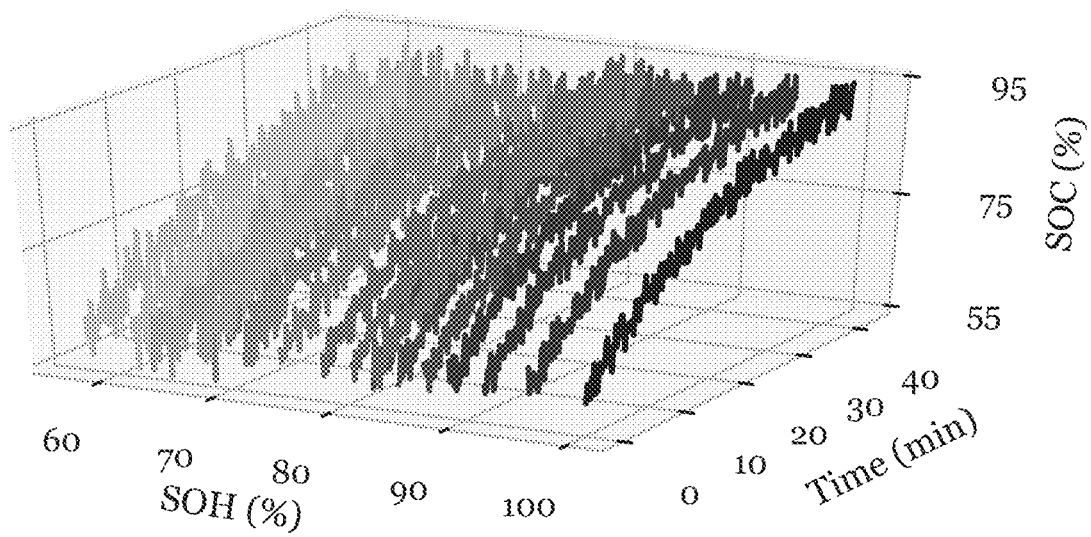
FIG. 27 is a partial charge profiles beginning at SOC=60% and ending at about SOC=92%.

In FIGS. 24-25 and in FIGS. 26-27, SOH is estimated by the CNN using partial charge curves. In FIGS. 24-25, the SOC range of 30% to about 85% is used while in FIGS. 26-27 an SOC range of 60% to about 92% is utilized. Table 6 shows further results from other partial charge profiles having different SOC ranges. The SOC in these validation datasets is assumed to have a mean error of under 4% to simulate a real world scenario. Although not overwhelmingly obvious, the results show that the larger SOC ranges generally render better SOH estimation results. This is most likely attributed to the longer ranges of data which reveal more of the battery's aging signature. However, the smaller SOC range of 85% to 97% achieves an MAE and a MAX of 1.6% and 3.5% which is nevertheless still competitive performance.

Figure 28:
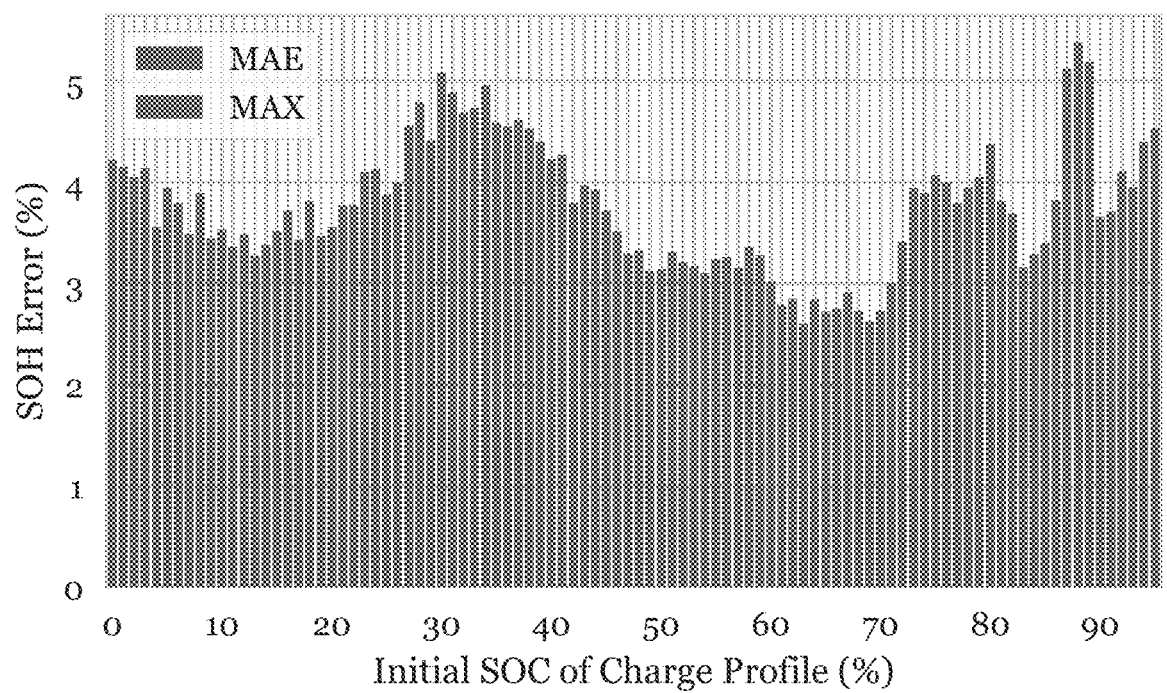
FIG. 28 is a graph of MAE and MAX values of SOH estimation performed over charge profiles beginning at various SOC values.

SOH estimation was performed with partial charge curves that sweep initial SOC=0% to as high as SOC=96% and the results are shown in FIG. 28. The used-charge profiles begin at different SOC values however, as mentioned above, they all have the same length of time of about 43 minutes. Interestingly, charge profiles beginning between SOC=5%-SOC=20% and between SOC=50%-SOC=70% have the lowest MAE and MAX error values however those starting between SOC=30%-40% have the highest. This may be attributed to the fact that the rate of change of the voltage is typically lower at SOC=30%-40% and therefore, this region can have relatively fewer distinctive ageing features. Nevertheless, as can be observed from FIG. 28, any 43 minute window of data collected during a charge event, regardless of the initial SOC, can be used to achieve competitive SOH estimation accuracy.

3 Combinations of Approaches

Above approaches to estimation of SOC using an RNN are described, and approaches to SOH estimation using CNN are described. As indicated above, in some examples, an estimated SOC is used as an input to a neural network estimating SOH, and more particularly an RNN approach described above may be used to estimate the SOC, which is then passed as an input to a SOH estimator implemented using a CNN approach described above.

It should be understood that the CNN approach described above may be used to estimate SOC rather than SOH. For example, the same structure used to estimate SOH is used with different training input (i.e., with known SOH replaced with known SOC). In yet other embodiments, a CNN may be used to jointly estimate SOC and SOH by training the CNN with data that includes both known SOH and known SOC.

Finally, the RNN approach described above may also be used to estimate SOH, or a combination of SOH and SOC with suitable training input.

4 Implementations and Alternatives

In some parameter estimation approaches, a gradient-based approach is used in which the parameter values are iteratively updated according to a computed gradient of the objective. One such gradient-based approach is a Back-Propagation procedure, but it should be understood that other procedures such as stochastic gradient procedures may equivalently be used.

The RNN structure introduced above should be understood to be only one example of a non-linear function structure that can be used to capture the cumulative effects of the measured quantities to yield accurate estimates of the battery state. For example, the transformation from input $x_k$ and past state $s_{k-1}$ to hidden state $s_k$ may use a deep neural network (DNN) structure with three, four, or more hidden layers. Convolutional neural networks can be used as well. That is, many different neural architectures can be used, the main ones being Recurrent Neural Networks (also RNN with LSTM or GRU), Deep Feedforward Neural Networks and Convolutional Neural Networks. A particular choice for structure of the non-linear function is a Long Short-Term Memory (LSTM) RNN, with details for such an implementation provided in the appended documents referenced below.

In some examples, the weights used in the estimation of battery states are selected based, for example, on the age of the battery system or other long-term conditions. For example, different weights are trained in different long-term conditions, thereby accommodating characteristically different non-linear mappings from observation to battery state.

The description above focuses on the battery state being the state of charge of the battery. Instead or in addition to the state of charge, a state of health of the battery system (e.g., capacity, peak voltage, internal resistance, self-discharge rate, etc.) may be estimated based on measurements in a like manner based on accurate measurements used to form appropriate training data sets.

The runtime estimation approach (i.e., implementation of the function N) may be implemented in software, in hardware, or in a combination of hardware and software. For example, software may include instructions, stored on a non-transitory machine-readable medium, that are executed on a processor (e.g., a general-purpose computer, embedded controller etc.). Hardware may include an Application Specific Integrated Circuit (ASIC), Field Programmable Gate Array (FPGA), discrete circuitry, and the like. The implementation may use digital representations of the quantities expressed above, with the measurements being digitized with Analog to Digital Converters (ADCs). In some implementations, some or all of the computations may be implemented using analog representations (e.g., analog voltages or currents). The parameter estimation approach may be implemented in hardware or software. Software implementations may use a general-purpose computers, and optionally may use attached processors such as Graphics Processing Units (GPUs).

REFERENCES

[Bole et al., 2014] Bole, B., Kulkarni, C. S., and Daigle, M. (2014). Randomized battery usage data set. Technical report, NASA Ames Prognostics Data Repository.

[Hochreiter and Schmidhuber, 1997] Hochreiter, S. and Schmidhuber, J. (1997). Long short-term memory. *Neural Computation,* 9(8):1735-1780.

[Kingma and Ba, 2014] Kingma, D. P. and Ba, J. (2014). Adam: A method for stochastic optimization. *CoRR,* abs/ 1412.6980.

[Kollmeyer, 2015] Kollmeyer, P. J. (2015). *Development and Implementation of a Battery-Electric Light-Duty Class 2a Truck including Hybrid Energy Storage.* PhD thesis, The University of Wisconsin—Madison.

[Kollmeyer et al., 2012] Kollmeyer, P. J., Lamb, W., Juang, L. W., McFarland, J. D., Jahns, T. M., and Sarlioglu, B. (2012). Design of an electric powertrain for a ford f150 crew cab truck utilizing a lithium battery pack and an interior pm synchronous machine drive. In 2012 *IEEE Transportation Electrification Conference and Expo (ITEC),* pages 1-8.

[Panasonic, 2016] Panasonic (2016). Panasonic NCR18650PF Lithium-Ion Battery Datasheet (June 2016).

What is claimed is:

1. A method comprising:
   receiving, by a trained model, a time series of values of battery attributes for a battery that are determined based on measurements performed by one or more sensors monitoring the battery,
      wherein the battery attributes include:
         an ambient temperature, and
         one or both of a battery voltage and a battery current, and
      wherein a portion of the time series of values of battery attributes represents battery attributes of the battery during a charging cycle and another portion of the time series of values of battery attributes of the battery represents battery attributes of the battery during a discharging cycle; and
   generating, by the trained model, a battery state for the battery based on the time series of values, the battery state including a state of health (SOH) of the battery,
   wherein the trained model is a single, processor-based trained model that is trained to generate battery states for the battery during charging cycles of the battery and during discharging cycles of the battery.

2. The method of claim 1, wherein the trained model is a convolutional neural network (CNN).

3. The method of claim 1, wherein the battery attributes further include a state-of-charge (SOC) of the battery and wherein receiving, by the trained model, the time series of values of battery attributes includes receiving a time series of values of the SOC of the battery.

4. The method of claim 3, further comprising:
   determining, using a recurrent neural network (RNN), the time series of values of the SOC based on the battery voltage and the battery current; and
   providing the time series of values of the SOC to the trained model as one of the time series of values of battery attributes received by the trained model.

5. The method of claim 1, wherein the battery state generated by the trained model based on the time series of values further includes a state-of-charge (SOC) of the battery.

6. The method of claim 1, wherein the SOH represents a capacity of the battery.

7. The method of claim 1, further comprising:
   providing the battery state for controlling operation of the battery or an electrical apparatus coupled to the battery.

8. The method of claim 1, wherein the battery comprises a rechargeable battery, and wherein receiving the time series of values for the one or more battery attributes includes receiving a time series of values spanning multiple charging and discharging cycles of the rechargeable battery.

9. The method of claim 1, wherein generating the battery state includes determining the battery state at a first time dependent on the time series of values of the battery attributes spanning greater than 30 minutes of operation of the battery.

10. The method of claim 1, further comprising:
    setting values of parameters of the trained model based on processing a plurality of time series of values of the battery attributes and corresponding battery states, the plurality of time series of values spanning a plurality of different state-of-charge profiles.

11. The method of claim 1, wherein the trained model is a single neural network.

12. The method of claim 1,
    wherein the generating, by the trained model, of battery state for the battery comprises: generating, by the trained model when the battery is discharging, based on the time series of values, the battery state for the battery when the battery is discharging, and wherein
    the method further comprises:
       receiving, by the trained model, a further time series of values of the battery attributes for the battery; and
       generating, by the trained model when the battery is charging, based on the received further time series of values, a further battery state for the battery when the battery is charging.

13. A battery monitoring system comprising:
one or more sensors configured to monitor a battery; and
a processor coupled to the one or more sensors, the processor configured to:
- receive the sensor data from the one or more sensors;
- receive, at a trained model implemented by the processor, a time series of values of battery attributes for the battery that are determined based on measurements performed by the one or more sensors,
  wherein the battery attributes include:
  - an ambient temperature, and
  - one or both of a battery voltage and a battery current, and
  wherein a portion of the time series of values of battery attributes represents battery attributes of the battery during a charging cycle and another portion of the time series of values of battery attributes of the battery represents battery attributes of the battery during a discharging cycle; and
- generate, via the trained model, a battery state for the battery based on the time series of values, the battery state including a state of health (SOH) of the battery,
  wherein the trained model is a single, processor-based trained model that is trained to generate battery states for the battery during charging cycles of the battery and during discharging cycles of the battery.

14. The system of claim 13, wherein the trained model is a convolutional neural network (CNN) comprising a plurality of layers, including at least one pooling layer and at least one fully connected layer.

15. The system of claim 13, wherein the time series of values of the battery attributes received by the trained model further include a time series of values of the state of charge (SOC) of the battery.

16. The system of claim 15, wherein the processor is further configured to:
- determine, using a recurrent neural network (RNN) implemented by the processor, the time series of values of the SOC based on the battery voltage and the battery current; and
- provide the time series of values of the SOC to the trained model as one of the time series of values of battery attributes received by the trained model.

17. The system of claim 13, wherein the battery state generated by the trained model based on the time series of values further includes a state-of-charge (SOC) of the battery.

18. The system of claim 13, wherein the battery comprises a rechargeable battery, and wherein the time series of values for the one or more battery attributes includes values spanning multiple charging and discharging cycles of the rechargeable battery.

19. A non-transitory computer readable media programmed with instructions, executable on one or more processors, to:
- receive, by a processor-based trained model, a time series of values of battery attributes for a battery that are determined based on measurements performed by one or more sensors monitoring the battery,
  wherein the battery attributes include:
  - an ambient temperature, and
  - one or both of a battery voltage and a battery current, and
  wherein a portion of the time series of values of battery attributes represents battery attributes of the battery during a charging cycle and another portion of the time series of values of battery attributes of the battery represents battery attributes of the battery during a discharging cycle; and
- generate, by the trained model, a battery state for the battery based on the time series of values, the battery state including a state of health (SOH) of the battery,
  wherein the trained model is a single, processor-based trained model that is trained to generate battery states for the battery during charging cycles of the battery and during discharging cycles of the battery.

20. The non-transitory computer readable media of claim 19, wherein the trained model is a convolutional neural network (CNN) comprising a plurality of layers, including at least one pooling layer and at least one fully connected layer.

21. The non-transitory computer readable media of claim 19, wherein the time series of values of the battery attributes received by the trained model further include a time series of values of the state of charge (SOC) of the battery.

22. The non-transitory computer readable media of claim 21, wherein the instructions, executable on the one or more processors, are further to:
- determine, using a recurrent neural network (RNN), the time series of values of the SOC based on the battery voltage and the battery current; and
- provide the time series of values of the SOC to the trained model as one of the time series of values of battery attributes received by the trained model.

\* \* \* \* \*